(12) United States Patent
Ahn

(10) Patent No.: US 11,089,406 B2
(45) Date of Patent: Aug. 10, 2021

(54) DISPLAY DEVICE

(71) Applicant: Samsung Display Co., Ltd., Yongin-si (KR)

(72) Inventor: Yi Joon Ahn, Seoul (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 16/676,442

(22) Filed: Nov. 7, 2019

(65) Prior Publication Data

US 2020/0177999 A1 Jun. 4, 2020

(30) Foreign Application Priority Data

Nov. 30, 2018 (KR) .................. 10-2018-0152466

(51) Int. Cl.
| | |
|---|---|
| H04R 9/04 | (2006.01) |
| H01L 51/52 | (2006.01) |
| H04R 9/06 | (2006.01) |
| H04R 1/02 | (2006.01) |
| G09G 3/3266 | (2016.01) |
| H01L 27/32 | (2006.01) |

(52) U.S. Cl.
CPC .......... *H04R 9/047* (2013.01); *H01L 51/529* (2013.01); *H01L 51/5237* (2013.01); *H04R 1/025* (2013.01); *H04R 9/06* (2013.01); *G09G 3/3266* (2013.01); *H01L 27/3244* (2013.01); *H04R 2499/15* (2013.01)

(58) Field of Classification Search
CPC . H04R 2499/15; H04R 2499/11; H04R 1/025
USPC .......................................... 381/388, 333, 177
See application file for complete search history.

(56) References Cited

U.S. PATENT DOCUMENTS

| | | | |
|---|---|---|---|
| 9,818,805 B2 | 11/2017 | Choi et al. | |
| 2003/0103642 A1* | 6/2003 | Kam ................. | H04R 9/043 381/431 |
| 2005/0276427 A1* | 12/2005 | Kam ................. | H04R 7/045 381/152 |
| 2010/0119101 A1 | 5/2010 | Fratti | |
| 2015/0340646 A1* | 11/2015 | Shin .................. | H01L 51/5237 257/40 |
| 2018/0270569 A1* | 9/2018 | Boyd ................. | H04R 7/20 |
| 2019/0014402 A1 | 1/2019 | Ahn et al. | |

FOREIGN PATENT DOCUMENTS

| | | | |
|---|---|---|---|
| JP | 2010-166515 | 7/2010 | |
| KR | 10-0576266 | 4/2006 | |
| KR | 10-2010-0015490 | 2/2010 | |
| KR | 10-2017-0114471 | 10/2017 | |
| KR | 10-2019-0006113 | 1/2019 | |
| WO | WO-2008136822 A2 * | 11/2008 | ............. H04R 7/045 |

* cited by examiner

*Primary Examiner* — Alexander Krzystan
(74) *Attorney, Agent, or Firm* — H.C. Park & Associates, PLC

(57) ABSTRACT

A display device including a display panel including a plurality of light emitting elements, a first substrate including a planar coil, and disposed under the display panel, a second substrate including a magnet spaced apart from the planar coil by a predetermined distance, and disposed under the display panel, and a power supply unit configured to supply alternating current power to the planar coil. The display device generates sound using an induced magnetic field generated by the planar coil and a magnetic field generated by the magnet.

18 Claims, 19 Drawing Sheets

DISPLAY DEVICE

CROSS-REFERENCE TO RELATED APPLICATIONS

This application claims priority from and the benefit of Korean Patent Application No. 10-2018-0152466, filed on Nov. 30, 2018, which is hereby incorporated by reference for all purposes as if fully set forth herein.

BACKGROUND

Field

Exemplary embodiments of the invention relate generally to a display panel on which a sound generating module is mounted, and a display device including the display panel.

Discussion of the Background

A display device provides information to a user by displaying various images on a display screen. In general, a display device displays information on an allocated screen. The display device is provided therein with a number of parts for driving the same. As a result of the area, thickness, and volume of each of the parts, it is difficult to implement a sufficiently thin display device, or a display device having a thin bezel. For example, among parts to be mounted on a display device, a sound generating module has a predetermined volume in order to generate vibration.

The above information disclosed in this Background section is only for understanding of the background of the inventive concepts, and, therefore, it may contain information that does not constitute prior art.

SUMMARY

Exemplary embodiments of the invention provide a thin display device through a display panel on which a sound generating module is mounted.

Additional features of the inventive concepts will be set forth in the description which follows, and in part will be apparent from the description, or may be learned by practice of the inventive concepts.

An exemplary embodiment of the invention provides a display device including a display panel including a plurality of light emitting elements, a first substrate including a first planar coil, and disposed under the display panel, a second substrate including a first magnet spaced apart from the first planar coil by a predetermined distance, and disposed under the display panel, and a power supply unit configured to supply alternating current power to the first planar coil.

The first planar coil and the first magnet may overlap each other in a plan view.

The first substrate may further include a first wiring connected to one end of the first planar coil and the power supply unit, and disposed on the same layer as the first planar coil, and a second wiring connected to the other end of the first planar coil and the power supply unit, and disposed on a different layer from that of the first planar coil.

The display device may further include a heat dissipating member disposed between the display panel and the first substrate, and containing graphite, and a static electricity blocking member disposed between the heat dissipating member and the first substrate, and containing metal. The first substrate may be disposed between the static electricity blocking member and the second substrate.

The first planar coil may be in contact with the static electricity blocking member. The first planar coil may include a wiring containing metal, and an insulation film surrounding the wiring.

The display device may further include a heat dissipating member disposed between the display panel and the second substrate, and containing graphite, and a static electricity blocking member disposed between the heat dissipating member and the second substrate, and containing metal. The second substrate may be disposed between the static electricity blocking member and the first substrate.

The first substrate may further include a base layer and an insulation layer. The second wiring may be disposed on the base layer. The insulation layer may cover the second wiring, and disposed on the base layer. The first wiring and the first planar coil may be disposed on the insulation layer.

The first substrate may include a first wiring connected to one end of the first planar coil and the power supply unit, a base layer on which the first planar coil and the first wiring are disposed, an insulation layer configured to cover the first planar coil and the first wiring, defined with a contact hole, and disposed on the base layer, a second planar coil disposed on the insulation layer, and including one end connected to the other end of the first planar coil through the contact hole, and a second wiring disposed on the insulation layer, and connected to the other end of the second planar coil and the power supply unit.

At least a portion of the second planar coil may overlap the first planar coil in a plan view.

The first substrate may further include a third planar coil disposed between the first planar coil and the second planar coil.

Each of the length of the first planar coil and the length of the second planar coil may be greater than the length of the third planar coil, respectively.

Each of the area of a region in which the first planar coil is disposed and the area of a region in which the second planar coil is disposed may be greater than the area of a region in which the third planar coil is disposed, respectively.

The second substrate may further include a second magnet spaced apart from the second planar coil by a predetermined distance, and overlapping the second planar coil in a plan view, and a third magnet spaced apart from the third planar coil by a predetermined distance, and overlapping the third planar coil in a plan view.

The first magnet may emit a magnetic field in a first direction. The second substrate may further include a second magnet, a third magnet, a fourth magnet, and a fifth magnet. The second magnet may emit a magnetic field in a second direction which is at an angle of 90 degrees to the first direction, and adjacent to the first magnet. The third magnet may emit a magnetic field in a third direction which is at an angle of 180 degrees to the first direction, and adjacent to the second magnet. The fourth magnet may emit a magnetic field in a fourth direction which is at an angle of 180 degrees to the second direction, and adjacent to the third magnet. The fifth magnet may emit a magnetic field in the first direction, and disposed adjacent to the fourth magnet.

A change from the first direction to the second direction, a change from the second direction to the third direction, and a change from the third direction to the fourth direction may be counterclockwise, respectively.

The first planar coil may overlap the second magnet in a plan view, and the first substrate may further include a second planar coil overlapping the fourth magnet in a plan view.

The first substrate may contain copper (Cu), an opening may be defined in the first substrate, and the first planar coil may be disposed in the opening.

The display device may include a display panel, an impact absorbing member, an induced magnetic field generating member, a fixed magnetic field generating member, and a power supply unit.

The display panel may include a plurality of organic light emitting elements.

The impact absorbing member may be disposed under the display panel and have a predetermined elastic force.

The induced magnetic field generating member may include a planar coil having a plurality of first coil wirings each extending in a first direction and a plurality of second coil wirings each extending in a second direction crossing the first direction. The induced magnetic field generating member may be disposed under the impact absorbing member, and the plurality of first coil wirings may be disposed on the same layer as the plurality of second coil wirings.

The fixed magnetic field generating member may be disposed under the induced magnetic field generating member, and may include a magnet spaced apart from the planar coil by a predetermined distance.

The power supply unit may supply alternating current power to the planar coil.

The display device may further include a heat dissipating member disposed between the impact absorbing member and the induced magnetic field generating member, and containing graphite, and a static electricity blocking member disposed between the heat dissipating member and the induced magnetic field generating member, and containing copper (Cu).

The display device may generate vibration by a fixed magnetic field generated by the fixed magnetic field generating member and an induced magnetic field generated by the induced magnetic field generating member, and generate sound by the vibration.

It is to be understood that both the foregoing general description and the following detailed description are exemplary and explanatory and are intended to provide further explanation of the invention as claimed.

BRIEF DESCRIPTION OF DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
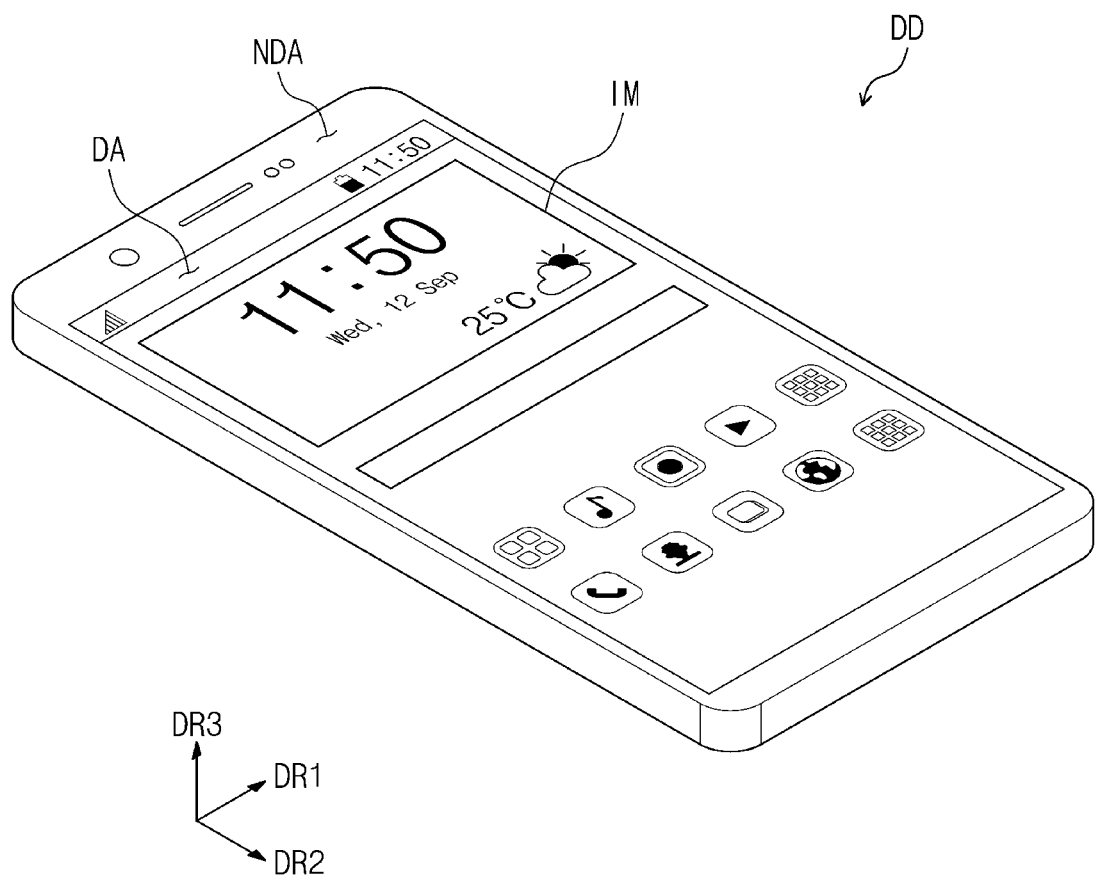
FIG. 1 is a perspective view of a display device according to an exemplary embodiment of the invention.

In the following description, for the purposes of explanation, numerous specific details are set forth in order to provide a thorough understanding of various exemplary embodiments of the invention. As used herein "exemplary embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various exemplary embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the accompanying drawings.

FIG. 1 is a perspective view showing a display device DD according to an exemplary embodiment of the invention.

In FIG. 1, the display device DD is exemplarily illustrated as being a smart phone. However, the inventive concept is not limited thereto. The display device DD may be a large electronic device, such as a television or a monitor, or a small and medium-sized electronic device such as a mobile phone, a tablet, a car navigation system unit, a game machine, or a smart phone.

In the display device DD, a display area DA and a non-display area NDA may be defined.

The display area DA on which an image IM is displayed is parallel to a plane defined by a first direction DR1 and a second direction DR2. The normal direction of the display area DA, that is, the thickness direction of the display device DD is indicated by a third direction DR3. A front surface (or an upper surface) and a back surface (or a lower surface) of each member are divided by the third direction DR3. However, directions indicated by the first to third directions DR1, DR2, and DR3 are merely examples, and may be different directions. Hereinafter, first to third directions correspond to the directions indicated by the first to third directions DR1, DR2, DR3, respectively, and are given the same reference numerals as the first to third directions DR1, DR2, DR3.

The shape of the display area DA shown in FIG. 1 is only exemplary, and the shape of the display area DA may be changed without limitation when necessary.

The non-display area NDA is a region adjacent to the display area DA, and on which the image IM is not displayed. A bezel area of the display device DD may be defined by the non-display area NDA.

The non-display area NDA may surround the display area DA. However, the inventive concept is not limited thereto. A shape of the display area DA, and a shape of the non-display area NDA may be relatively designed.

Figure 2:
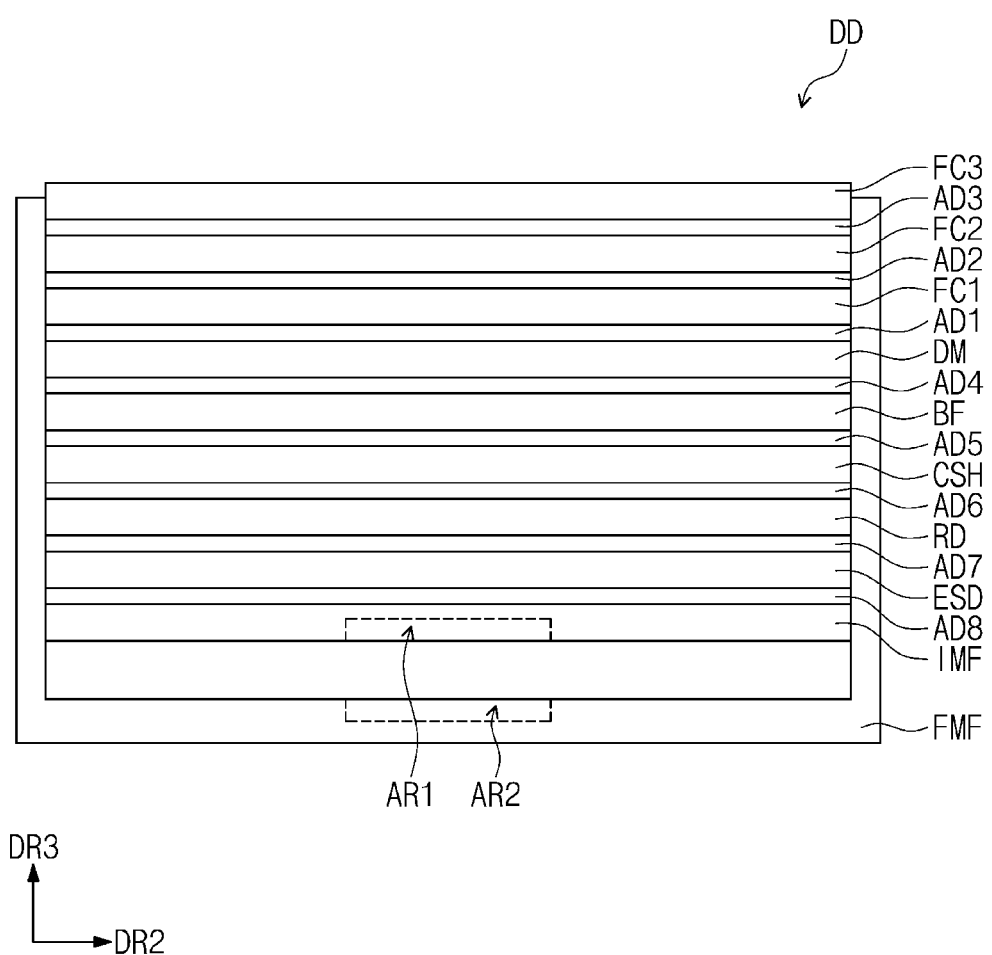
FIG. 2 is a cross-sectional view of a display device according to an exemplary embodiment of the invention.
Figure 3A:
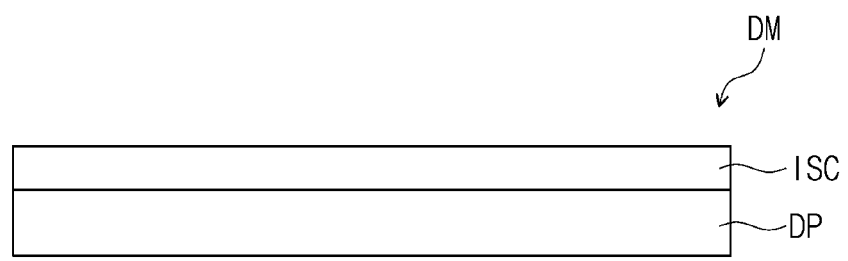
FIG. 3A and FIG. 3B are cross-sectional views of the display module shown in FIG. 2.
Figure 3B:
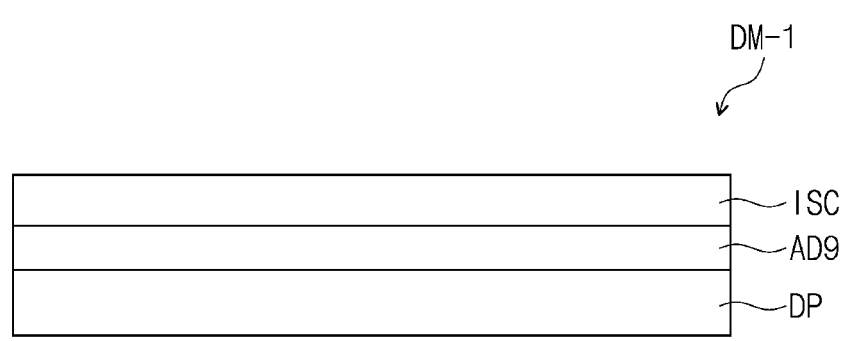

FIG. 2 is a cross-sectional view of the display device DD according to an exemplary embodiment of the invention. FIG. 3A and FIG. 3B are cross-sectional views of display modules DM and DM-1, display module DM being shown in FIG. 2. FIG. 2 illustrates a cross-section defined by the second direction DR2 and the third direction DR3.

The display device DD may include a display module DM, a plurality of functional layers FC1 to FC3, a base film BF, an impact absorbing member CSH, a heat dissipating member RD, a static electricity blocking member ESD, an induced magnetic field generating member IMF, a fixed magnetic field generating member FMF, and a plurality of adhesive members AD1 to AD8.

In an exemplary embodiment of the invention, each of the adhesive members AD1 to AD8 may be a pressure sensitive adhesive (PSA).

The functional layers FC1 to FC3 may be disposed on the display module DM.

A first functional layer FC1 may be adhered to the display module DM by a first adhesive member AD1. A second functional layer FC2 may be adhered to the first functional layer FC1 by a second adhesive member AD2. A third functional layer FC3 may be adhered to the second functional layer FC2 by a third adhesive member AD3.

The functional layers FC1 to FC3 may each contain a polymer material. The functional layers FC1 to FC3 may each be in the form of a film.

In an exemplary embodiment of the invention, the first functional layer FC1 may be a polarizing functional layer for polarizing incident light. The second functional layer FC2 may be an impact absorbing functional layer for absorbing impact applied from the outside. The third functional layer FC3 may be a window functional layer constituting the outer surface of the display device DD. In another exemplary embodiment of the invention, some of the first to third functional layers FC1 to FC3 may be omitted.

The base film BF, the impact absorbing member CSH, the heat dissipating member RD, the static electricity blocking member ESD, and the induced magnetic field generating member IMF are disposed under the display module DM.

The base film BF may be disposed under the display module DM. The base film BF may be adhered to a lower portion of the display module DM by a fourth adhesive member AD4.

The base layer BS may include a polymer material. In an exemplary embodiment of the invention, the base film BF may be a black film.

The impact absorbing member CSH may be disposed under the base film BF. The impact absorbing member CSH may be adhered to a lower portion of the display module DM by a fifth adhesive member AD5.

The impact absorbing member CSH may include a polymer material. The impact absorbing member CSH may be a layer for absorbing impact applied from the outside.

In an exemplary embodiment of the invention, the impact absorbing member CSH may have a modulus of 0.01 MPa to 500 Mpa. When the modulus of the impact absorbing member CSH is less than 0.01 Mpa, the impact absorbing member CSH becomes soft, thereby failing to effectively absorb external impacts from the outside. Also, when the modulus of the impact absorbing member CSH exceeds 500 Mpa, the impact absorbing member CSH becomes hard, thereby also effectively failing to absorb external impacts from the outside.

In an exemplary embodiment of the invention, the impact absorbing member CSH may include thermoplastic polyurethane, or foam rubber.

The heat dissipating member RD may be disposed under the impact absorbing member CSH. The heat dissipating member RD may be adhered to a lower portion of the impact absorbing member CSH by a sixth adhesive member AD6.

The heat dissipating member RD may be a component for emitting heat generated from display module DD to the outside. In an exemplary embodiment of the invention, the heat dissipating member RD may contain graphite or stainless.

The static electricity blocking member ESD may be disposed under the heat dissipating member RD. The static electricity blocking member ESD may be adhered to the lower portion of the heat dissipating member RD by a seventh adhesive member AD7.

The static electricity blocking member ESD may prevent the display module DM from being affected by static electricity applied from the outside. The static electricity blocking member ESD may contain metal. For example, the static electricity blocking member ESD may contain copper (Cu), iron (Fe), or aluminum (Al).

The induced magnetic field generating member IMF may be disposed under the static electricity blocking member ESD. The induced magnetic field generating member IMF may be adhered to a lower portion of the static electricity blocking member ESD by an eighth adhesive member AD8.

The induced magnetic field generating member IMF may include an induced magnetic field generating area AR1 (hereinafter, a first area). In an exemplary embodiment of the invention, in the first area AR1, a planar coil PCL (see FIG. 8A) for generating an induced magnetic field may be disposed.

The direction of the induced magnetic field generated from the first area AR1 may be continuously changed.

The fixed magnetic field generating member FMF may be disposed under the induced magnetic field generating member IMF. The fixed magnetic field generating member FMF may include a fixed magnetic field generating area AR2 (hereinafter, a second area). In an exemplary embodiment of the invention, in the second area AR2, a magnet MG (see FIG. 8B) for generating a fixed magnetic field may be disposed.

In an exemplary embodiment of the invention, the fixed magnetic field generating member FMF may be a bracket for accommodating the display module DM, the impact absorbing member CSH, the heat dissipating member RD, the static electricity blocking member ESD, and the induced magnetic field generating member IMF.

The first area AR1 and the second area AR2 may be spaced apart from each other by a predetermined distance in the third direction DR3.

In the display device DD, gravitational force and repulsive force may be repeatedly generated between the induced magnetic field generating member IMF and the fixed magnetic field generating member FMF due to an induced magnetic field generated from the first area AR1 and a fixed magnetic field generated from the second area AR2.

The display device may vibrate as a result of such gravitational force and repulsive force, and the display device DD may generate sound using the vibration.

In another exemplary embodiment of the invention, at least some of the adhesive members AD1 to AD8 may be omitted.

Referring to FIG. 3A, the display module DM may include a display panel DP and an input sensing circuit ISC. The input sensing circuit ISC may sense a touch and/or pressure applied from the outside.

The input sensing circuit ISC may be directly disposed on a thin film encapsulation layer (not shown) of the display panel DP. Here, the term "directly disposed" means that the input sensing circuit ISC is disposed on the display panel without a separate adhesive member.

Referring to FIG. 3B, a display module DM-1 may be used instead of the display module DM of FIG. 3A, and may include the display panel DP, the input sensing circuit ISC, and a ninth adhesive member AD9. The display panel DP and the input sensing circuit ISC may be adhered to each other by the ninth adhesive member AD9.

Figure 4:
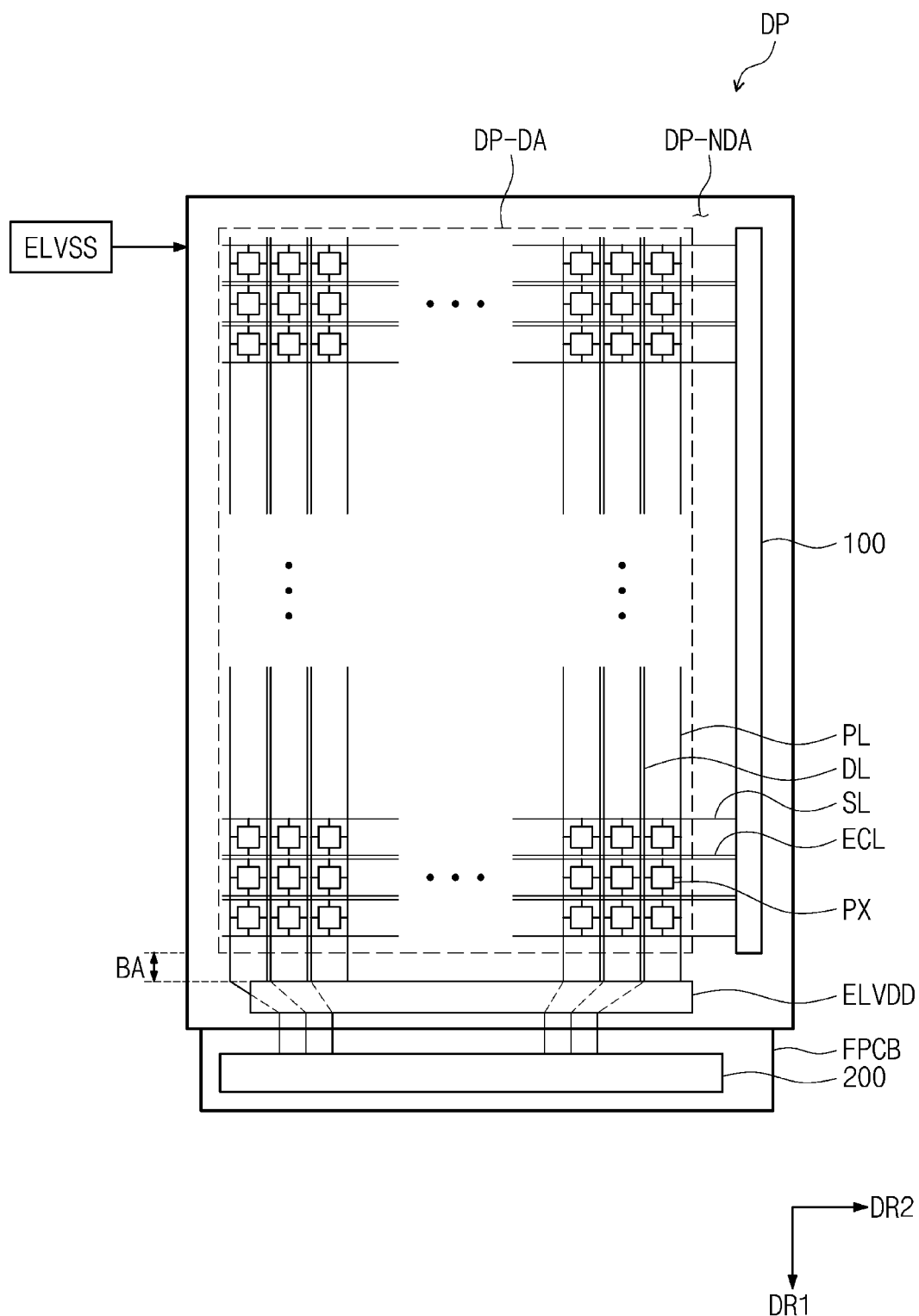
FIG. 4 is a plan view of a display panel according to an exemplary embodiment of the invention.

FIG. 4 is a plan view of a display panel DP according to an exemplary embodiment of the invention.

The display panel DP includes a display area DP-DA and a non-display area DP-NDA on a plane. In the exemplary embodiment, the non-display area DP-NDA may be defined along an edge of the display area DP-DA. The display area DP-DA and the non-display area DP-NDA of the display panel DP may correspond to the display area DD-DA and the non-display area DD-NDA of the display device DD shown in FIG. 1, respectively.

The display panel DP may include a scan driving unit 100, a data driving unit 200, a plurality of scan lines SL, a plurality of light emission control lines ECL, a plurality of data lines DL, a plurality of power lines PL, and a plurality of pixels PX (hereinafter, pixels). The pixels PX are disposed in the display area DP-DA. The pixels PX each include an organic light emitting diode OLED (see FIG. 5) and a pixel circuit CC (see FIG. 5) connected thereto.

The scan driving unit 100 may include a scan driver and a light emission control driver.

The scan driver generates scan signals and sequentially outputs the generated scan signals to the scan lines GL. The light emission control driver generates light emission control signals and outputs the generated light emission control signals to the light emission control lines ECL.

In another exemplary embodiment of the invention, the scan driver and the light emission control driver may not be divided in the scan driving unit 100, but may be formed as one circuit.

The scan driving unit 100 may include a plurality of thin film transistors formed through the same process as a process for forming a driving circuit of the pixels PX, for example, a Low Temperature Polycrystalline Silicon (LTPS) process or a Low Temperature Polycrystalline Oxide (LTPO) process.

The data driving unit 200 outputs data signals to the data lines DL. The data signals are analog voltages corresponding to gray scale values of image data.

In an exemplary embodiment of the invention, the data driving unit 200 is mounted on a flexible printed circuit board FPCB, and the flexible printed circuit board FPCB may be connected to pads disposed at one end of the data lines DL. However, the inventive concept is not limited thereto. The data driving unit 200 may be directly disposed on the display panel DP.

The scan lines SL are extended in the second direction DR2, and may be arranged in the first direction DR1 crossing the second direction DR2. In an exemplary embodiment of the invention, the second direction DR2 and the first direction DR1 may be orthogonal, but the inventive concept is not limited thereto.

The light emission control lines ECL are extended in the second direction DR2, and may be arranged in the first direction DR1. That is, the light emission control lines ECL may each be arranged side-by-side to a corresponding scan line among the scan lines SL.

The data lines DL are extended in the first direction DR1, and may be arranged in the second direction crossing the first direction DR1. The data lines DL may provide data signals to corresponding pixels PX.

The power lines PL are extended in the first direction DR1, and are arranged in the second direction DR2. The power lines PL may provide a first power supply voltage ELVDD to corresponding pixels PX.

The plurality of pixels PX are each connected to a corresponding scan line among the scan lines SL, a corresponding light emission control line among the light emission control lines ECL, a corresponding data line among the data lines DL, and a corresponding power line among the power lines PL.

The non-display area DP-NDA of the display panel DP may include a bending area BA. When the display panel DP is bent relative to the bending area BA, the area of the non-display area DP-NDA is reduced on a plane defined by the first direction DR1 and the second direction DR2, so that the display device DD having a thin bezel may be provided. That is, the display device DD having a small area of the non-display area DD-NDA in FIG. 1 may be provided.

Figure 5:
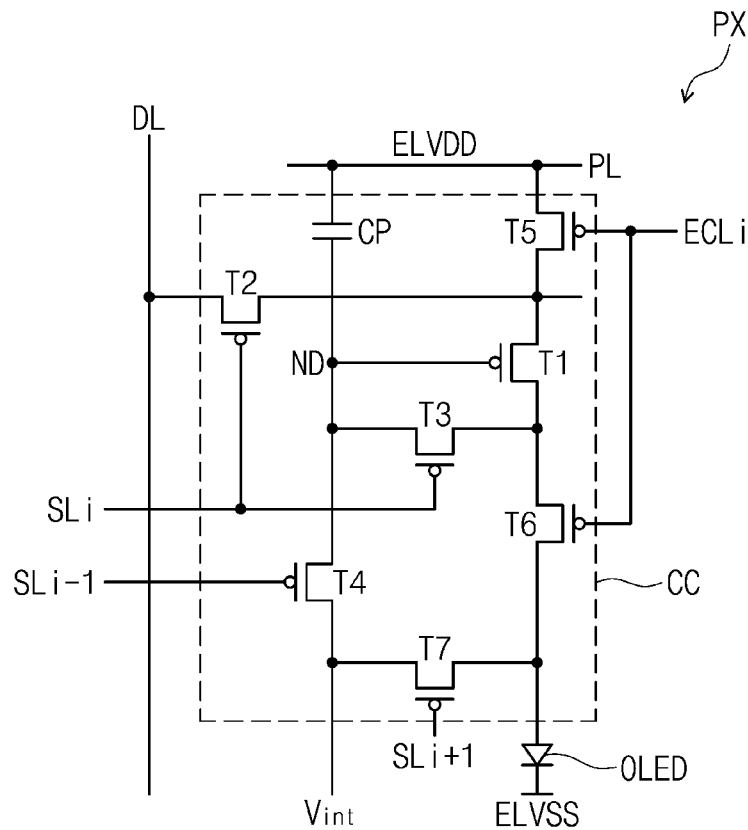
FIG. 5 is an equivalent circuit diagram of a pixel according to an exemplary embodiment of the invention.
Figure 6:
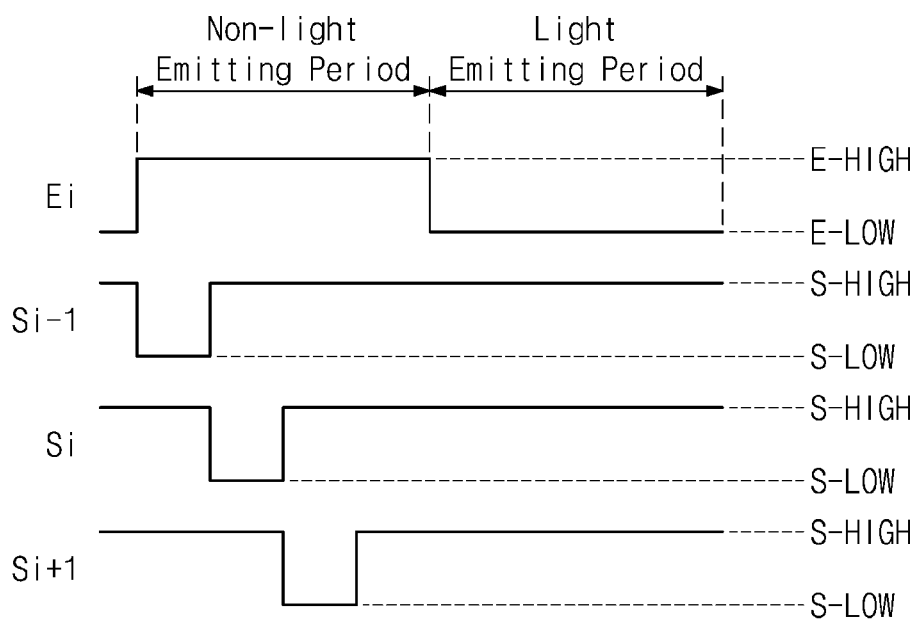
FIG. 6 is a view illustratively showing a light emission control signal and scan signals applied to the pixel of FIG. 5.

FIG. 5 is an equivalent circuit diagram of a pixel PX according to an exemplary embodiment of the invention. FIG. 6 exemplarily illustrates a light emission control signal Ei and scan signals Si−1, Si, and Si+1 applied to the pixel of FIG. 5. FIG. 5 exemplarily illustrates the pixel PX connected to an ith scan line SLi and an ith light emission control line ECLi.

The pixel PX may include an organic light emitting diode OLED and a pixel circuit CC. The pixel circuit CC may include a plurality of transistors T1 to T7 and a capacitor CP. The pixel circuit CC controls the amount of current flowing through the organic light emitting diode OLED in correspondence to a data signal.

The organic light emitting diode OLED may emit light at a predetermined luminance in correspondence to the amount of current provided from the pixel circuit CC. To this end, the level of the first power supply voltage ELVDD may be set to be higher than the level of a second power supply voltage ELVSS.

The plurality of transistors T1 to T7 may each include an input electrode (or a source electrode), an output electrode (or a drain electrode), and a control electrode (or a gate electrode). In the present disclosure, any one of the input electrode and the output electrode may be referred to as a first electrode, and the other thereof may be referred to as a second electrode for convenience.

A first electrode of a first transistor T1 is connected to the first power supply voltage ELVDD via a fifth transistor T5, and a second electrode thereof is connected to an anode electrode of the organic light emitting diode OLED via a sixth transistor T6. The first transistor T1 may be referred to as a driving transistor in the present disclosure.

The first transistor T1 controls the amount of current flowing through the organic light emitting diode OLED in correspondence to a voltage applied to a control electrode.

A second transistor T2 is connected between the data line DL and the first electrode of the first transistor T1. In addition, a control electrode of the second transistor T2 is connected to the ith scan line SLi. The second transistor T2 is turned on when an ith scan signal Si is provided to the ith scan line SLi, and electrically connects the data line DL and the first electrode of the first transistor T1.

A third transistor T3 is connected between the second electrode and the control electrode of the first transistor T1. A control electrode of the third transistor T3 is connected to the ith scan line SLi. The third transistor T3 is turned on when an ith scan signal Si is provided to the ith scan line SLi, and electrically connects the second electrode of the first transistor T1 and the control electrode. Accordingly, when the third transistor T3 is turned on, the first transistor T1 is connected as a diode.

A fourth transistor T4 is connected between a node ND and an initialization power generating unit (not shown). In addition, a control electrode of the fourth transistor T4 is connected to an i−1st scan line SLi−1. The fourth transistor T4 is turned on when an i−1st scan signal Si−1 is provided to the i−1st scan line SLi−1, and provides an initialization voltage Vint to the node ND.

A firth transistor T5 is connected between the power line PL and the first electrode of the first transistor T1. A control electrode of the fifth transistor T5 is connected to an ith light emission control line ECLi.

A sixth transistor T6 is connected between the second electrode of the first transistor T1 and the anode electrode of the organic light emitting diode OLED. In addition, a control electrode of the sixth transistor T6 is connected to the ith light emission control line ECLi.

A seventh transistor T7 is connected between the initialization power generating unit (not shown) and the anode electrode of the organic light emitting diode OLED. In addition, a control electrode of the seventh transistor T7 is connected to an i+1st scan line SLi+1. The seventh transistor T7 is turned on when an i+1st scan signal Si+1 is provided to the i+1st scan line SLi+1, and provides the initialization voltage Vint to the anode electrode of the organic light emitting diode OLED.

The seventh transistor T7 may improve the capability of the pixel PX in expressing black. Specifically, when the seventh transistor T7 is turned on, a parasitic capacitor (not shown) of the organic light emitting diode OLED is discharged. Then, when black luminance is implemented, the organic light emitting diode OLED does not emit light due to leakage current from the first transistor T1, and accordingly, the capability of expressing black may be improved.

Additionally, FIG. 5 illustrates the control electrode of the seventh transistor T7 being connected to the i+1st scan line SLi+1, but the inventive concept is not limited thereto. In another exemplary embodiment of the invention, the control electrode of the seventh transistor T7 may be connected to the ith scan line SLi or the i−1st scan line SLi−1.

Although FIG. 5 illustrates a PMOS as a reference, the inventive concept is not limited thereto. In another exemplary embodiment of the invention, the pixel PX may be formed of an NMOS. In yet another exemplary embodiment of the invention, the pixel PX may be formed by a combination of an NMOS and a PMOS.

The capacitor CP is disposed between the power line PL and the node ND. The capacitor CP stores a voltage corresponding to a data signal. When the fifth transistor T5 and the sixth transistor T6 are turned on in accordance to the voltage stored in the capacitor CP, the amount of current flowing through the first transistor T1 may be determined.

In the inventive concept, the structure of the pixel PX is not limited to the structure shown in FIG. 5. In another exemplary embodiment of the invention, the pixel PX may be implemented in various forms for emitting the organic light emitting diode OLED.

Referring to FIG. 6, the light emission control signal Ei may have a high level E-HIGH or a low level E-LOW. The scan signals SLi−1, SLi, and SLi_1 may each have a high level S-HIGH or a low level S-LOW.

When the light emission control signal Ei has the high level E-HIGH, the fifth transistor T5 and the sixth transistor T6 are turned off. When the fifth transistor T5 is turned off, the power line PL and the first electrode of the first transistor T1 are electrically blocked. When the sixth transistor T6 is turned off, the second electrode of the first transistor T1 and the anode electrode of the organic light emitting diode OLED are electrically blocked. Accordingly, while the light emission control signal Ei having the high level E-HIGH is being provided to the ith light emission control line ECLi, the organic light emitting diode OLED does not emit light.

Thereafter, when the i−1st scan signal Si−1 provided to the i−1st scan line SLi−1 has the low level S-LOW, the fourth transistor T4 is turned on. When the fourth transistor T4 is turned on, the initialization voltage Vint is provided to the node ND.

When the ith scan signal Si provided to the ith scan line SLi has the low level S-LOW, the second transistor T2 and the third transistor T3 are turned on.

When the second transistor T2 is turned on, a data signal is provided to the first electrode of the first transistor T1. At this time, since the node ND is initialized to the initialization voltage Vint, the first transistor T1 is turned on. When the first transistor T1 is turned on, a voltage corresponding to the data signal is provided to the node ND. At this time, the capacitor CP stores a voltage corresponding to the data signal.

When the i+1st scan signal Si+1 provided to the i+1st scan line SLi+1 has the low level S-LOW, the seventh transistor T7 is turned on.

When the seventh transistor T7 is turned on, the initialization voltage Vint is provided to the anode electrode of the organic light emitting diode OLED so that the parasitic capacitor of the organic light emitting diode OLED is discharged.

When the light emission control signal Ei provided to the light emission control like ECLi has the low level E-LOW, the fifth transistor T5 and the sixth transistor T6 are turned on. When the fifth transistor T5 is turned on, the first power supply voltage ELVDD is provided to the first electrode of the first transistor T1. When the sixth transistor T6 is turned on, the second electrode of the first transistor T1 and the anode electrode of the organic light emitting diode OLED are electrically connected. Then, the organic light emitting diode OLED generates light having a predetermined luminance in correspondence to the amount of current provided.

Figure 7:
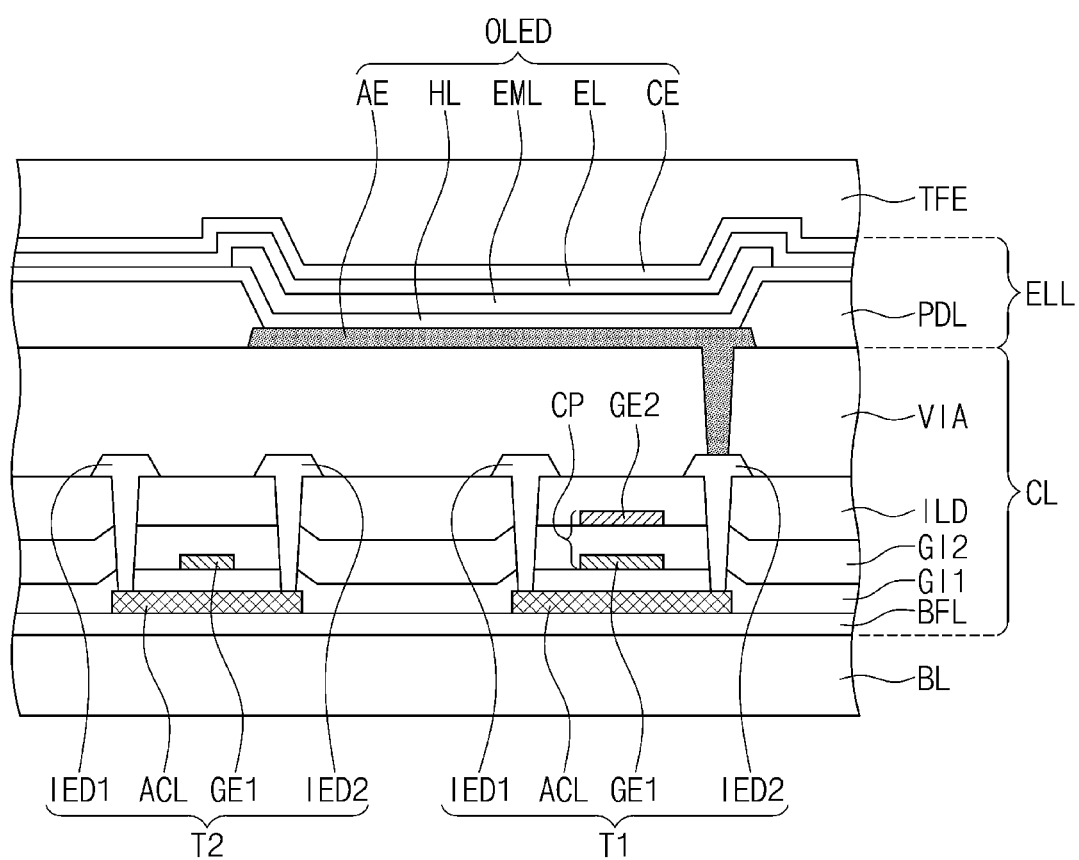
FIG. 7 shows a cross-section of a portion of a pixel according to an exemplary embodiment of the invention.

FIG. 7 shows a cross-section of a portion of the pixel PX (see FIG. 5) according to an exemplary embodiment of the invention. In FIG. 7, the first transistor T1 and the second transistor T2 are exemplarily illustrated. However, the structure of the first transistor T1 and the structure of the second transistor T2 are not limited thereto. In FIG. 7, a second electrode IED2 of the first transistor T1 is shown as being in direct contact with an anode electrode AE of the pixel PX. However, this is in the form of a cross-sectional shape and is thus shown. In practice, as shown in FIG. 5, the first transistor T1 may be connected to the anode electrode AE of the pixel PX via the sixth transistor T6. However, the inventive concept is not limited thereto. In another exemplary embodiment of the invention, the second electrode IED2 of the first transistor T1 may be in direct contact with the anode electrode AE of the pixel PX.

The display panel DP (see FIG. 4) may include a base member BL, a circuit layer CL, a light emitting element layer ELL, and an encapsulation layer TFE.

The circuit layer CL may include a buffer layer BFL, gate insulation layers GI1 and GI2, an interlayer insulation layer ILD, a circuit insulation layer VIA, and the transistors T1 and T2.

The light emitting element layer ELL may include the organic light emitting diode OLED and a pixel definition film PDL.

The encapsulation layer TFE encapsulates the light emitting element layer ELL to protect the light emitting element layer ELL from external oxygen or moisture.

On one surface of the base member BL, the buffer layer BFL is disposed.

The buffer layer BFL prevents impurities present in the base member BL from being introduced into the pixel PX during a manufacturing process. Particularly, the buffer layer BFL prevents impurities from being diffused into active parts ACL of the transistors T1 and T2 constituting the pixel PX.

Impurities may be introduced from the outside or may be generated from the base member BL when the base member BL is thermally decomposed. Impurities may be gas or sodium discharged from the base member BL. In addition, the buffer layer BFL blocks moisture introduced into the pixel PX from the outside.

On the buffer layer BFL, the active parts ACL respectively constituting the transistors T1 and T2 are disposed. The active parts ACL may each contain polysilicon or amorphous silicon. In addition, the active parts ACL may each contain a metal oxide semiconductor.

The active parts ACL may include a channel area serving as a path through which an electron or a hole may move, and a first ion doping area and a second ion doping area disposed with the channel area interposed therebetween.

On the buffer layer BFL, a first gate insulation layer GI1 covering the active parts ACL is disposed. The first gate insulation layer GI1 includes an organic film and/or an inorganic film. The first gate insulation layer GI1 may include a plurality of inorganic films. The plurality of inorganic films may each include a silicon nitride layer and a silicon oxide layer.

On the first gate insulation layer GI1, control electrodes GE1 respectively constituting the transistors T1 and T2 are disposed. A control electrode GE1 of the first transistor T1 may be any one of two electrodes constituting the capacitor CP. On the first gate insulation layer GI1, at least a portion of the scan lines SL (see FIG. 4) and the light emission control lines ECL (see FIG. 4) may be disposed.

On the first gate insulation layer GI1, a second gate insulation layer GI2 covering the control electrodes GE1 is disposed. The second gate insulation layer GI2 includes an organic film and/or an inorganic film. The second gate insulation layer GI2 may include a plurality of inorganic films. The plurality of inorganic films may include a silicon nitride layer and a silicon oxide layer.

On the second gate insulation layer GI2, the other electrode GE2 of the two electrodes constituting the capacitor CP (see FIG. 5) may be disposed. That is, the control electrode GE1 disposed on the first gate insulation layer GI1 and the electrode GE2 disposed on the second gate insulation layer GI2 may overlap each other to define the capacitor CP shown in FIG. 5. However, the structure in which electrodes constituting the capacitor CP are disposed is not limited thereto.

On the second gate insulation layer GI2, the interlayer insulation layer ILD covering the electrode GE2 is disposed. The interlayer insulation layer ILD includes an organic film and/or an inorganic film. The interlayer insulation layer ILD may include a plurality of inorganic films. The plurality of inorganic films may include a silicon nitride layer and a silicon oxide layer.

On the interlayer insulation layer ILD, at least a portion of the data line DL (see FIG. 4) and the power line PL (see FIG. 4) may be disposed. On the interlayer insulation layer ILD, first electrodes IED1 and second electrodes IED2 of each of the transistors T1 and T2 may be disposed.

The first electrodes IED1 and the second electrodes IED2 may each be connected to the corresponding active parts ACL through through-holes passing through the gate insulation layers GI1 and Gi2 and the interlayer insulation layer ILD.

On the interlayer insulation layer ILD, the circuit insulation layer VIA covering the first electrodes IED1 and the second electrodes IED2 is disposed. The circuit insulation layer VIA includes an organic film and/or an inorganic film. The circuit insulation layer VIA may provide a flat surface.

On the circuit insulation layer VIA, the pixel definition film PDL and the organic light emitting diode OLED are disposed.

The organic light emitting diode OLED may include the anode electrode AE, a hole control layer HL, a light emitting layer EML, an electron control layer EL, and a cathode electrode CE.

Figure 8A:
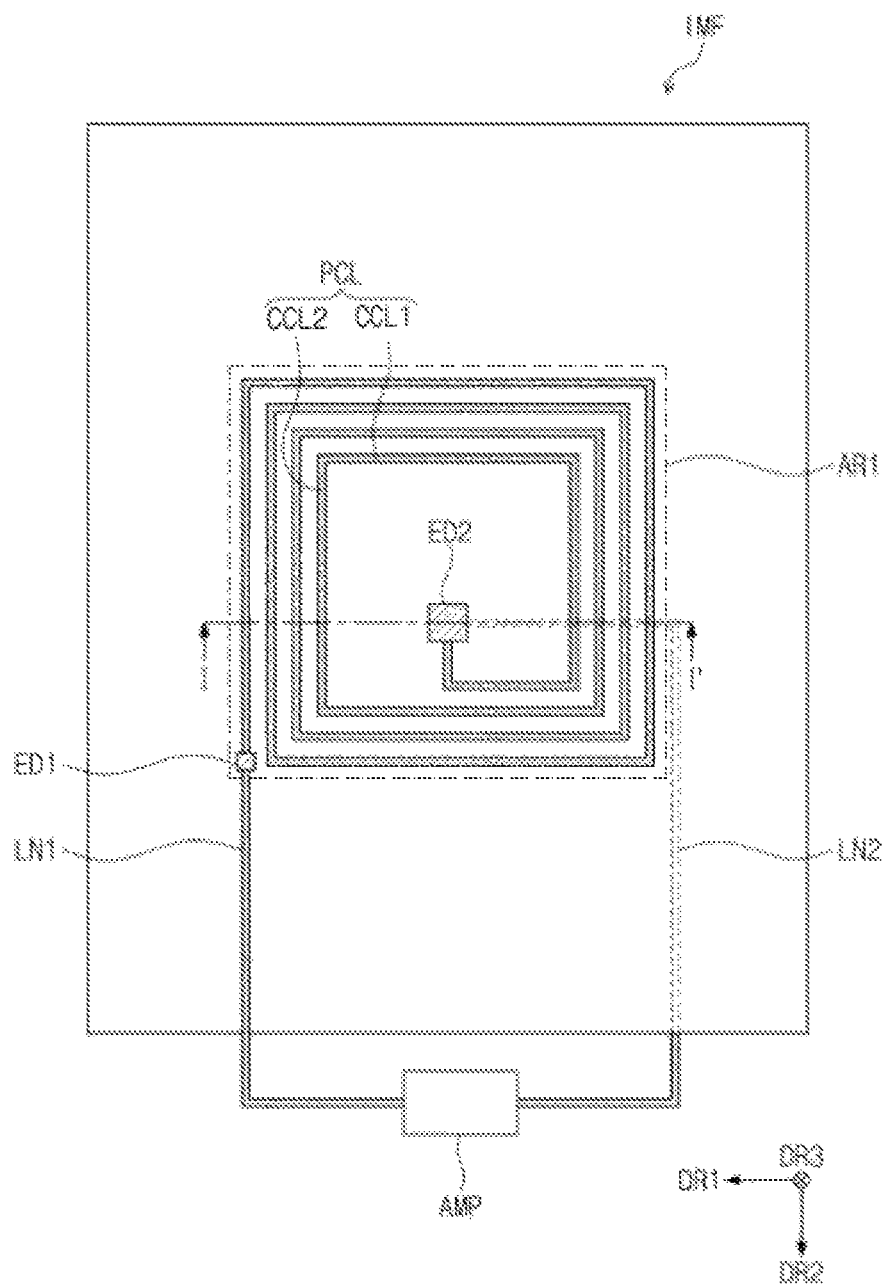
FIG. 8A is a plan view showing an induced magnetic field generating member and a power supply unit according to an exemplary embodiment of the invention.
Figure 8B:
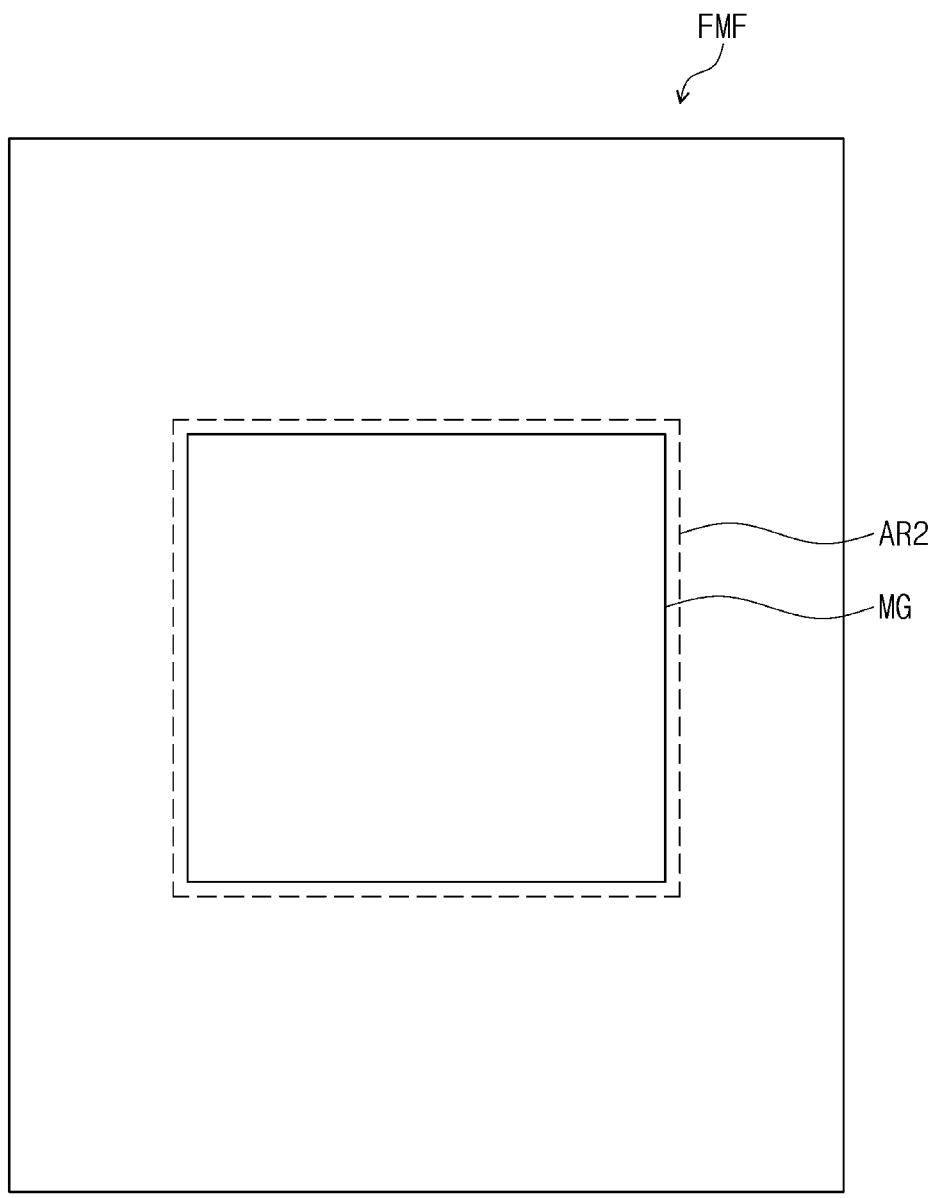
FIG. 8B is a plan view of a fixed magnetic field generating member according to an exemplary embodiment of the invention.
Figure 8B:
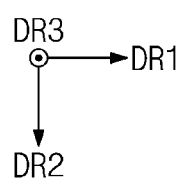
Figure 9:
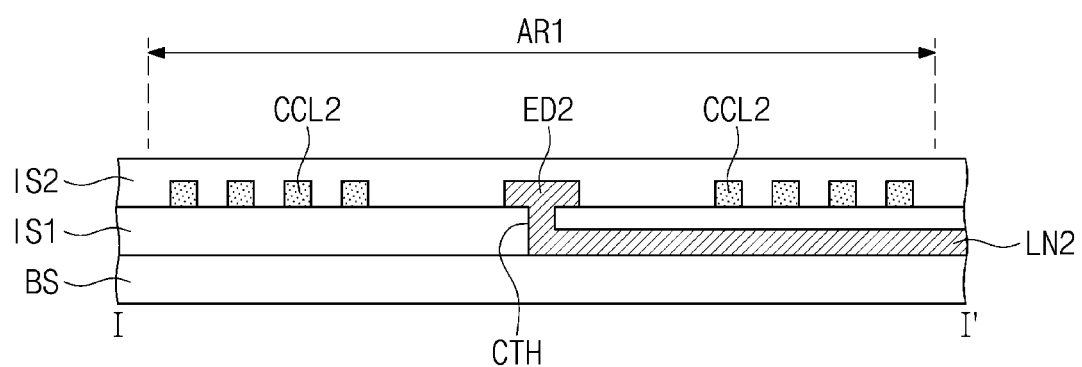
FIG. 9 is a cross-sectional view taken along line I-I' shown in FIG. 8A.

FIG. 8A is a plan view showing an induced magnetic field generating member IMF and a power supply unit AMP according to an exemplary embodiment of the invention. FIG. 8B is a plan view of the fixed magnetic field generating member FMF according to an exemplary embodiment of the invention. FIG. 9 is a cross-sectional view taken along line I-I' shown in FIG. 8A.

Referring to FIG. 8A and FIG. 9, the induced magnetic field generating member IMF may include a base layer BS, a planar coil PCL, wirings LN1 and LN2, and insulation layers IS1 and IS2.

The planar coil PCL may include first coil wirings CCL1 extended in a direction parallel to the first direction DR1 and second coil wirings CCL2 extended in a direction parallel to the second direction DR2.

The first coil wirings CCL1 may each be connected to a corresponding second coil wiring CCL2 among the second coil wirings CCL2.

The first coil wirings CCL1 and the second coil wirings CCL2 may be disposed on the same plane, so that the planar coil PCL may be implemented.

Since the coil wirings CCL1 and CCL2 constituting the planar coil PCL are disposed on the same plane, a thin coil may be implemented.

One end ED1 (or a first end) of the planar coil PCL may be connected to a first wiring LN1 and the other end ED2 (or a second end) may be connected to a second wiring LN2.

The second wiring LN2 may be disposed on a different layer from the planar coil PCL and the first wiring LN1.

Referring to FIG. 9, in an exemplary embodiment of the invention, the second wiring LN2 may be disposed on the base layer BS.

A first insulation layer IS1 covers the second wiring LN2, and may be included on the base layer BS. On the base layer BS, a contact hole CTH may be defined.

The planar coil PCL and the first wiring LN1 may be disposed on the first insulation layer IS1.

The second insulation layer IS2 covers the planar coil PCL and the first wiring LN1, and may be disposed on the first insulation layer IS1. In another exemplary embodiment of the invention, the second insulation layer IS2 may be omitted.

In an exemplary embodiment of the invention, the base layer BS, the first insulation layer IS1, and the second insulation layer IS2 may each contain polyimide. However, a material that each of the base layer BS, the first insulation layer IS1, and the second insulation layer IS2 includes is not limited thereto, and any material having insulation properties may be used.

The power supply unit AMP may provide alternating current power to the planar coil PCL through the first wiring LN1 and the second wiring LN2.

The alternating current power provided by the power supply unit AMP may be generated in correspondence to an electrical signal received from an audio codec of the display device DD.

When the planar coil PCL receives the alternating current power from the power supply unit AMP, the planar coil PCL may generate an induced magnetic field which changes the direction thereof repeatedly in the third direction DR3 according to Ampere's Law.

Referring to FIG. 8B, on the second area AR2 of the fixed magnetic field generating member FMF, a magnet MG may be disposed. The magnet MG may be disposed to overlap the planar coil PCL in a plan view.

Figure 10A:
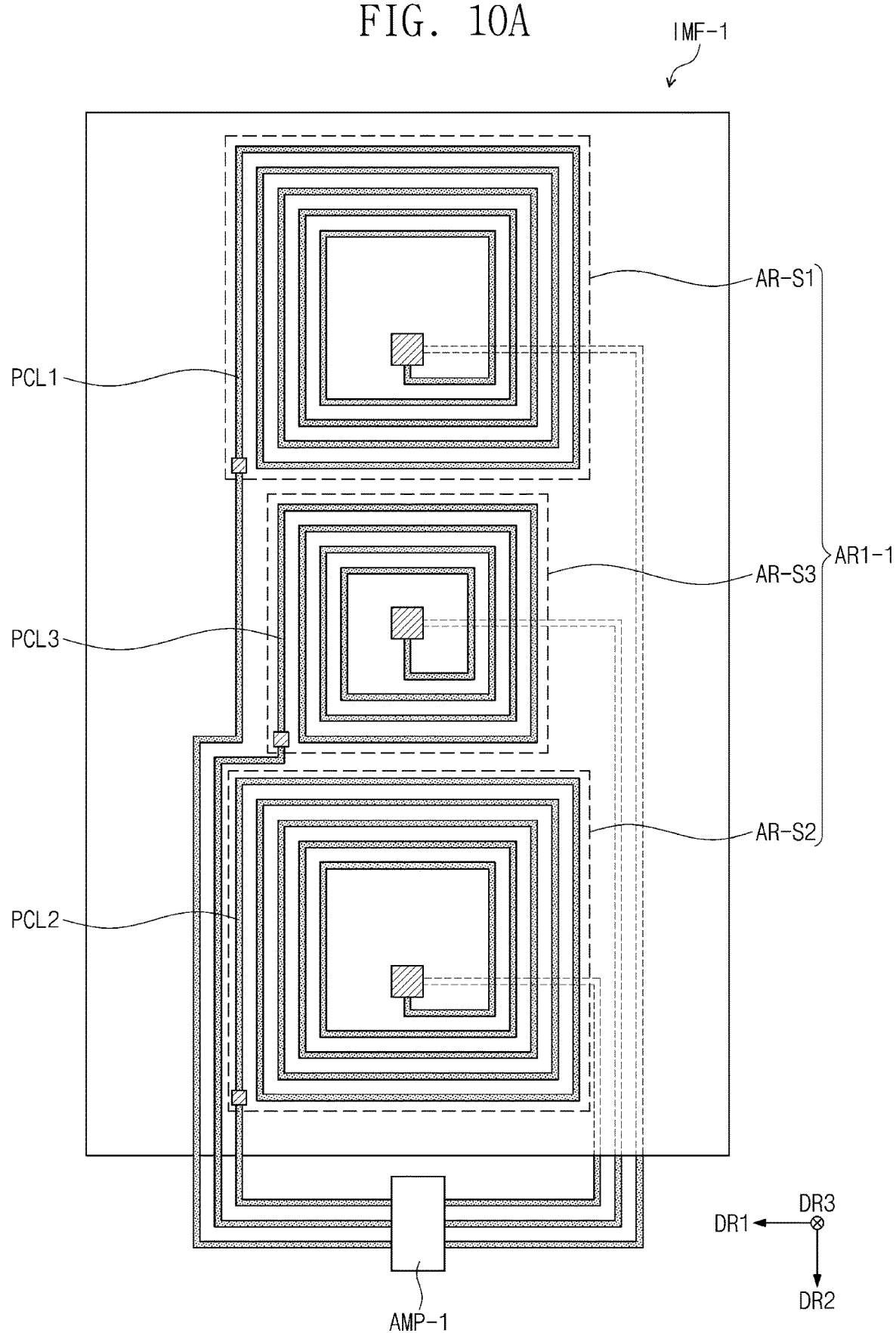
FIG. 10A is a plan view showing an induced magnetic field generating member and a power supply unit according to an exemplary embodiment of the invention.
Figure 10B:
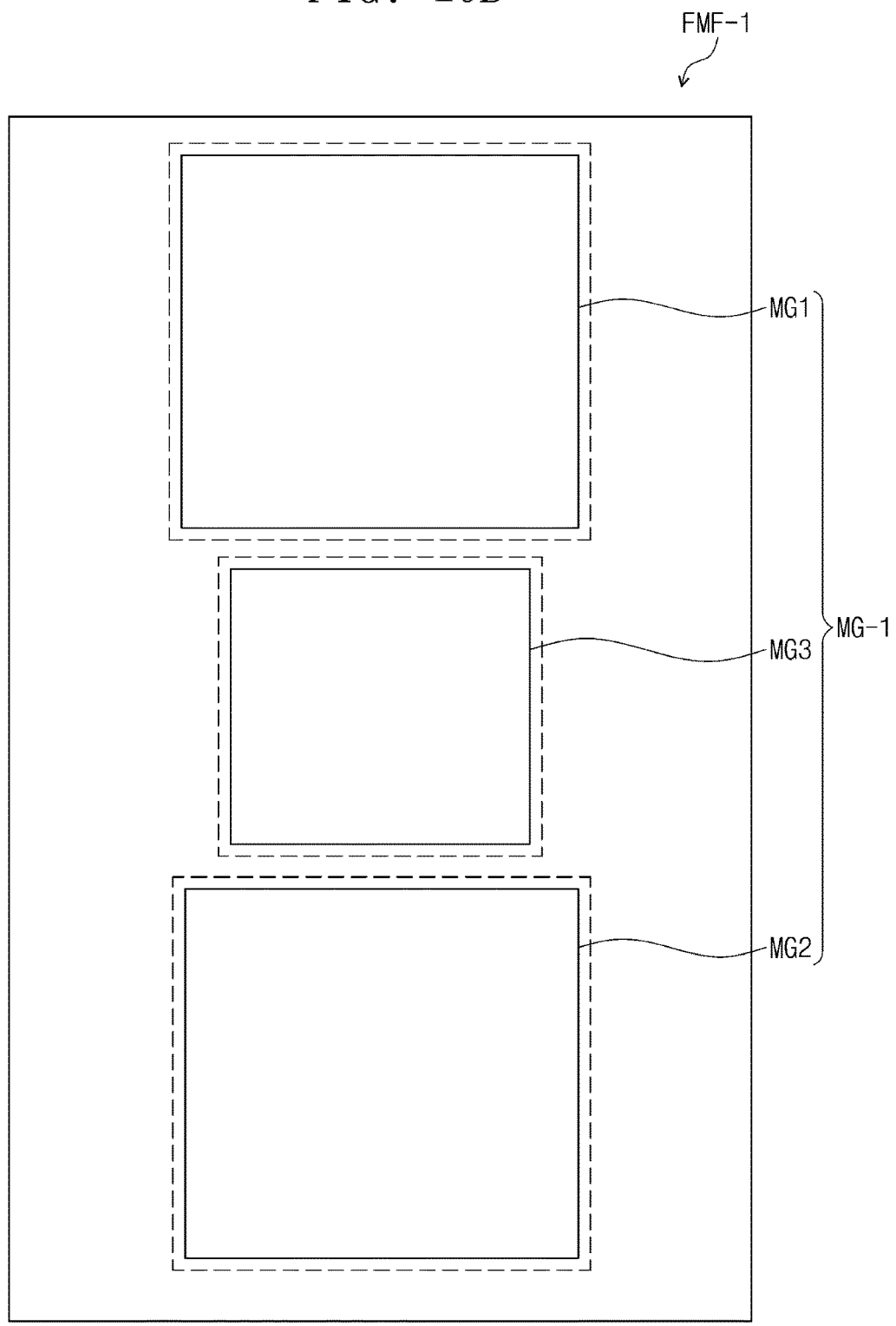
FIG. 10B is a plan view showing a fixed magnetic field generating member according to an exemplary embodiment of the invention.

FIG. 10A is a plan view showing an induced magnetic field generating member IMF-1 and a power supply unit AMP-1 according to an exemplary embodiment of the invention. FIG. 10B is a plan view showing a fixed magnetic field generating member FMF-1 according to an exemplary embodiment of the invention.

The induced magnetic field generating member IMF-1 may include a first planar coil PCL1, a second planar coil PCL2, and a third planar coil PCL3.

The induced magnetic field generating member IMF-1 may have a first area AR1-1 defined therein. The first area AR1-1 may include a first sub-area AR-S1 in which the first planar coil PCL1 is disposed, a second sub-area AR-S2 in which the second planar coil PCL2 is disposed, and a third sub-area AR-S3 in which the third planar coil PCL3 is disposed.

Referring to FIG. 1 and FIG. 10A, the first planar coil PCL1 and the second planar coil PCL2 are each disposed adjacent to the non-display area NDA, and the third planar coil PCL3 may be disposed between the first planar coil PCL1 and the second planar coil PCL2.

In an exemplary embodiment of the invention, each of the length of the first planar coil PCL1 and the length of the second planar coil PCL2 may be greater than the length of the third planar coil PCL3. In an exemplary embodiment of the invention, each of the area of the first sub-area AR-S1 and the area of the second sub-area AR-S2 may be greater than the area of the third sub-area AR-S3.

Accordingly, the magnitude of an induced magnetic field generated in each of the first sub-area AR-S1 and the second sub-area AR-S2 may be greater than the magnitude of an induced magnetic field generated in the third sub-area AR-S3.

In an edge portion of the display device DD, less vibration is generated than in a central portion thereof due to an influence of an external housing or adhesive members when force is applied. Therefore, as shown in FIG. 10A, by increasing the magnitude of the induced magnetic field generated in the first sub-area AR-S1 and the second sub-area AR-S2 and by reducing the magnitude of the induced magnetic field generated in the third sub-area AR-S3, any problems caused by such an imbalance may be solved.

Referring to FIG. 10B, the fixed magnetic field generating member FMF-1 may include a magnet MG-1. The magnet MG-1 may include a first magnet MG1 corresponding to the first sub-area AR-S1, a second magnet MG2 corresponding to the second sub-area AR-S2, and a third magnet MG3 corresponding to the third sub-area AR-S3.

In an exemplary embodiment of the invention, each of the area of the first magnet MG1 and the area of the second magnet MG2 may be greater than the area of the third sub-area MG3. In an exemplary embodiment of the invention, each of the magnitude of a magnetic field generated from the first magnet MG1 and the magnitude of a magnetic field generated from the second magnet MG2 may be greater than the magnitude of a magnetic field generated from the third magnet MG3.

The power supply unit AMP-1 may provide alternating current power to the planar coils PCL1, PCL2, and PCL3.

Figure 11A:
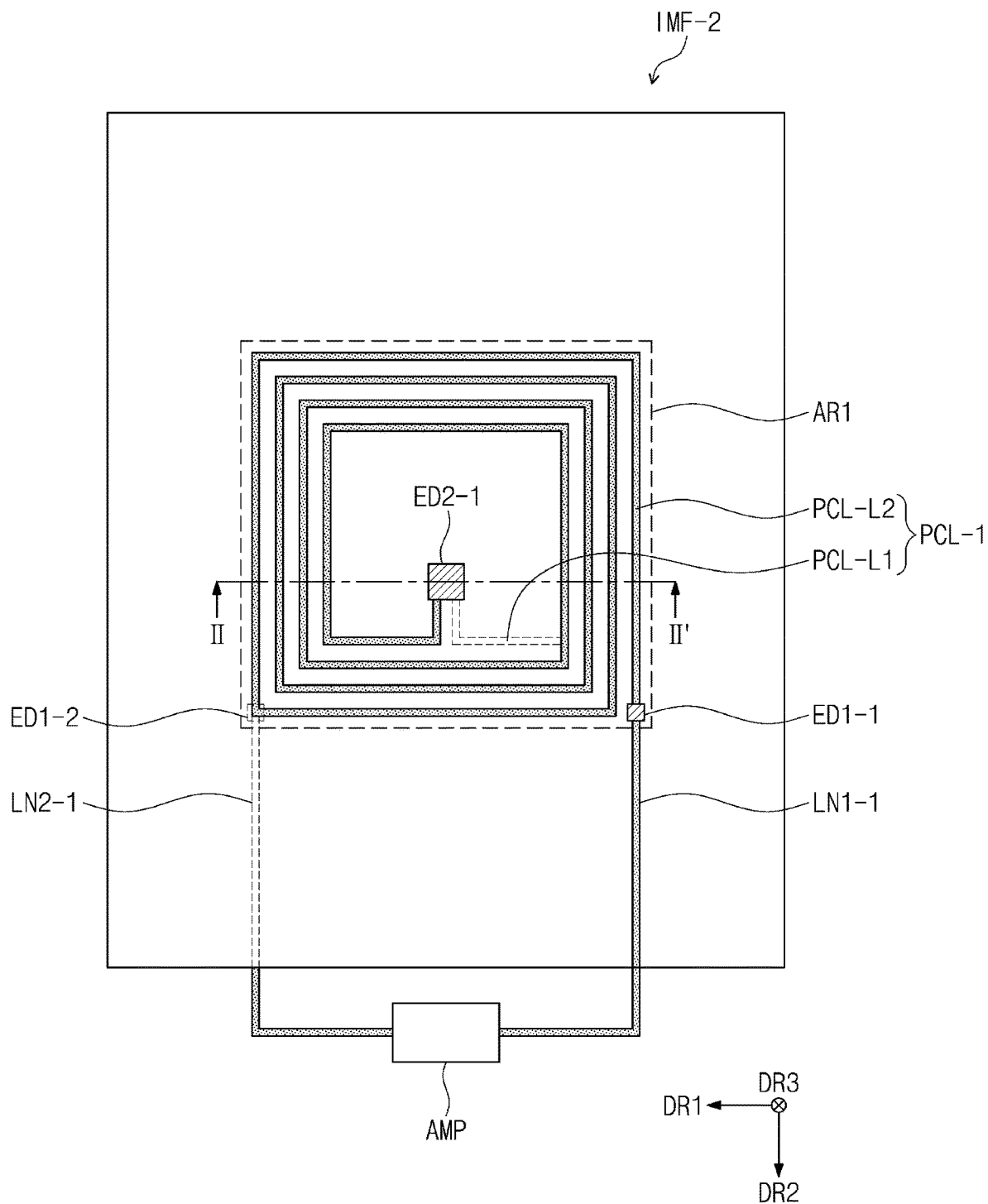
FIG. 11A is a plan view showing an induced magnetic field generating member and a power supply unit according to an exemplary embodiment of the invention.
Figure 11B:
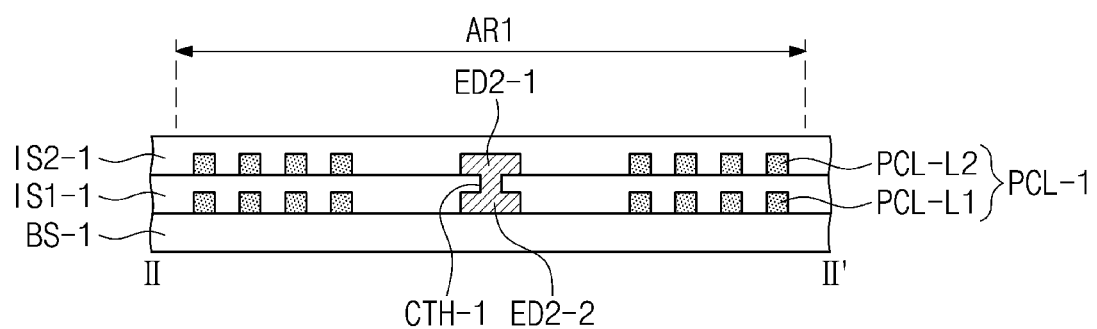
FIG. 11B is a cross-sectional view taken along line II-II' of FIG. 11A.

FIG. 11A is a plan view showing an induced magnetic field generating member IMF-2 and the power supply unit AMP according to an exemplary embodiment of the invention. FIG. 11B is a cross-sectional view taken along line II-II' of FIG. 11A.

The induced magnetic field generating member IMF-2 may include a planar coil PCL-1 composed of two layers.

The planar coil PCL-1 may include a lower planar coil PCL-L1 and an upper planar coil PCL-L2.

The lower planar coil PCL-L1 may be disposed on a base layer BS-1.

A first insulation layer IS1-1 covers the lower planar coil PCL-L1, and may be disposed on the base layer BS-1.

The upper planar coil PCL-L2 may be disposed on the first insulation layer IS1-1.

A second insulation layer IS2-1 covers the upper planar coil PCL-L2, and may be disposed on the first insulation layer IS1-1.

A first end ED1-1 of the upper planar coil PCL-L2 may be connected to a first wiring LN1-1, and a first end ED1-2 of the lower planar coil PCL-L1 may be connected to a second wiring LN2-1. Accordingly, the first wiring LN1-1 is disposed on the same layer as the upper planar coil PCL-L2, and the second wiring LN2-1 may be disposed on the same layer as the lower planar coil PCL-L1.

A second end ED2-1 of the upper planar coil PCL-L2 may be connected to a second end ED2-2 of the lower planar coil PCL-L1 through a contact hole CTH-1 defined on the first insulation layer IS1-1.

In an exemplary embodiment of the invention, at least a portion of the upper planar coil PCL-L2 may overlap the lower planar coil PCL-L1.

When the power supply unit AMP applies alternating current power to the planar coil PCL-1, the direction of an induced magnetic field generated from the upper planar coil PCL-L2 and the direction of an induced magnetic field generated from the lower planar coil PCL-L1 are the same. Accordingly, the magnitude of the induced magnet field generated from the planar coil PCL-1 may be further increased.

Figure 12A:
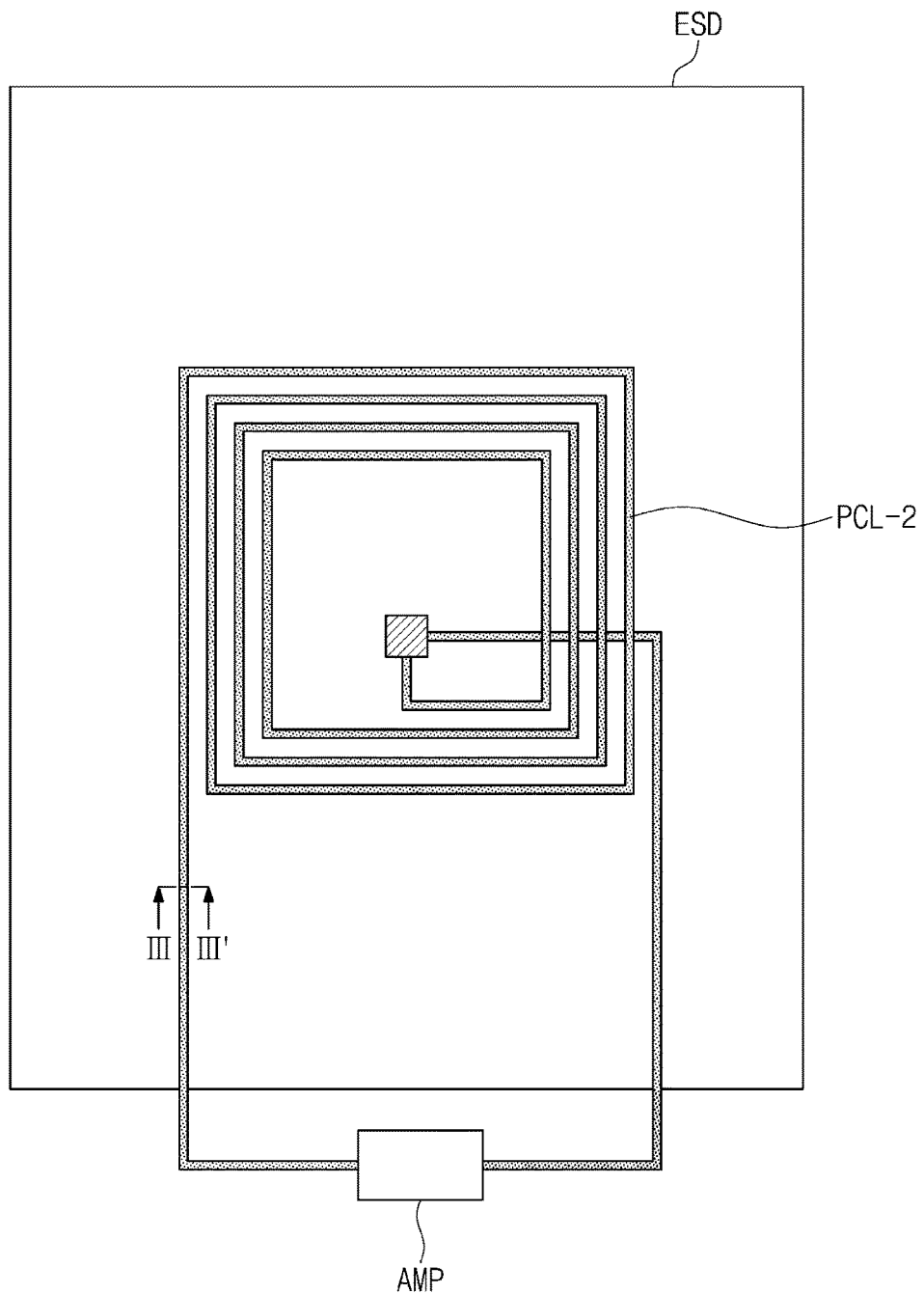
FIG. 12A is a view showing a static electricity blocking member and a planar coil according to an exemplary embodiment of the invention.
Figure 12B:
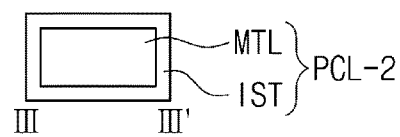
FIG. 12B is a cross-sectional view of a planar coil taken along III-III' in FIG. 12A.

FIG. 12A is a view showing a static electricity blocking member ESD and a planar coil PCL-2 according to an exemplary embodiment of the invention. FIG. 12B is a cross-sectional view of the planar coil PCL-2 taken along III-III' in FIG. 12A In an exemplary embodiment of the inventive concept, the planar coil PCL-2 may be directly attached to the static electricity blocking member ESD.

As shown in FIG. 12B, the planar coil PCL-2 may include a metal line MTL and an insulation film IST surrounding the metal line MTL.

The metal line MTL may be insulated from the static electricity blocking member ESD by the insulation film IST.

Figure 13:
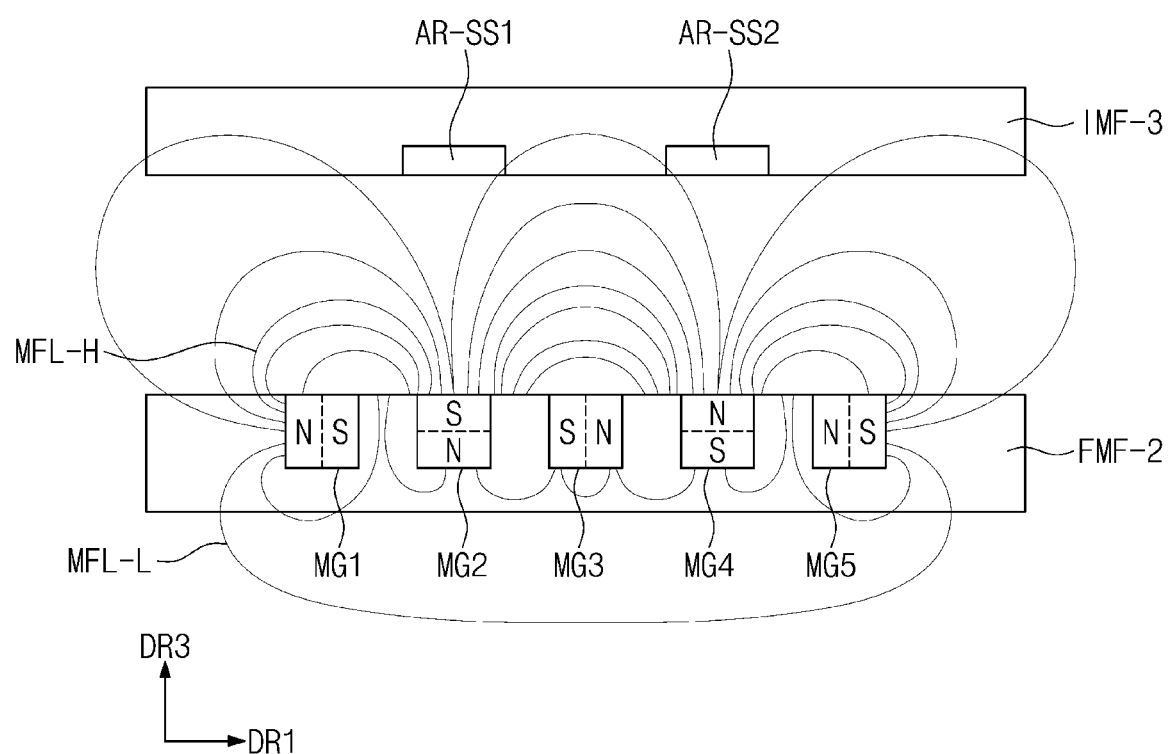
FIG. 13 is a plan view showing an induced magnetic field generating member and a fixed magnetic field generating member according to an exemplary embodiment of the invention.

FIG. 13 is a plan view showing an induced magnetic field generating member IMF-3 and a fixed magnetic field generating member FMF-2 according to an exemplary embodiment of the invention.

The fixed magnetic field generating member FMF-2 may include first to fifth magnets MG1 to MG5.

The first to fifth magnets MG1 to MG5 may be disposed adjacent to each other in order.

In an exemplary embodiment of the invention, the arrangement of the magnets MG1 to MG5 may be a Halbach array.

For example, the first magnet MG1 may be arranged such that the left side thereof is an N pole and the right side thereof is an S pole. Accordingly, the first magnet MG1 may emit a magnetic field in a left side direction.

The second magnet MG2 may be arranged such that the lower side thereof is an N pole and the upper side thereof is an S pole. Accordingly, the second magnet MG2 may emit a magnetic field in a downward direction.

The third magnet MG3 may be arranged such that the right side thereof is an N pole and the left side thereof is an S pole. Accordingly, the third magnet MG3 may emit a magnetic field in a right side direction.

The fourth magnet MG4 may be arranged such that the upper side thereof is an N pole and the lower side thereof is an S pole. Accordingly, the fourth magnet MG4 may emit a magnetic field in an upward direction.

The fifth magnet MG5 may be arranged such that the left side thereof is an N pole and the right side thereof is an S pole. Accordingly, the fifth magnet MG5 may emit a magnetic field in a left side direction.

That is, from the first magnet MG1 toward the fifth magnet MG5, the direction of a magnetic field respectively emitted from the magnets MG1 to MG5 may be changed in a counterclockwise direction.

As such, when the first to fifth magnets MG1 to MG5 are arranged in the Halbach array, magnetic field lines MFL-H formed on an upper side of the fixed magnetic field generating member FMF-2 may have high density, and magnetic field lines MFL-L formed on a lower side of the fixed magnetic field generating member FMF-2 may have low density.

That is, using the Halbach array, the magnetic fields formed by the magnets MG1 to MG5 may be efficiently used.

In an exemplary embodiment of the invention, the induced magnetic field generating member IMF-3 may include a first sub-area AR-SS1 overlapping the second magnet MG2 and a second sub-area AR-SS2 overlapping the fourth magnet MG4. The first sub-area AR-SS1 and the second sub-area AR-SS2 may emit an induced magnetic field, respectively.

Figure 14:
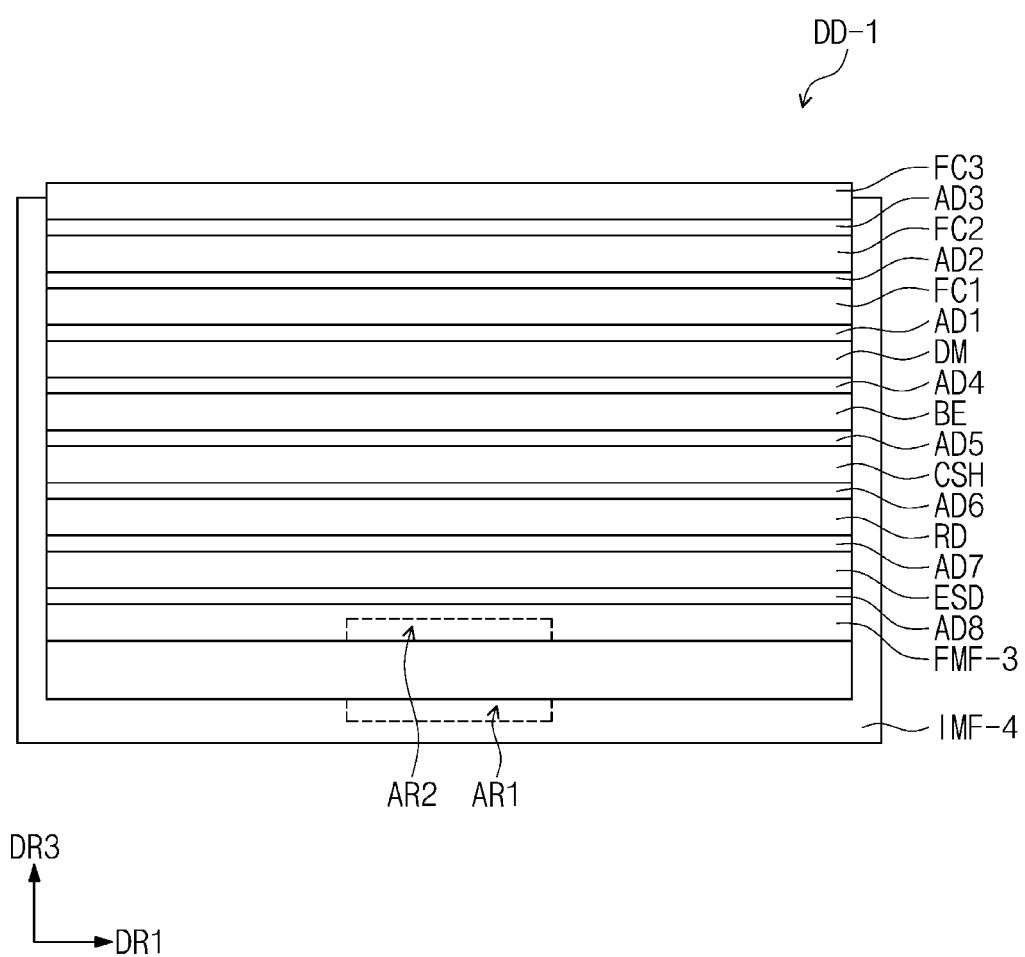
FIG. 14 is a cross-sectional view of a display device according to an exemplary embodiment of the invention.

FIG. 14 is a cross-sectional view of a display device DD-1 according to an exemplary embodiment of the invention.

In the display device DD-1 shown in FIG. 14, the positions of an induced magnetic field generating member IMF-4 and a fixed magnetic field generating member FMF-3 are switched with the positions of the induced magnetic field generating member IMF and the fixed magnetic field generating member FMF shown in FIG. 2.

In this case, the induced magnetic field generating member IMF-4 may be a bracket.

Other descriptions related to FIG. 14 are omitted since they are substantially the same as the description of the display device DD shown in FIG. 2.

Figure 15:
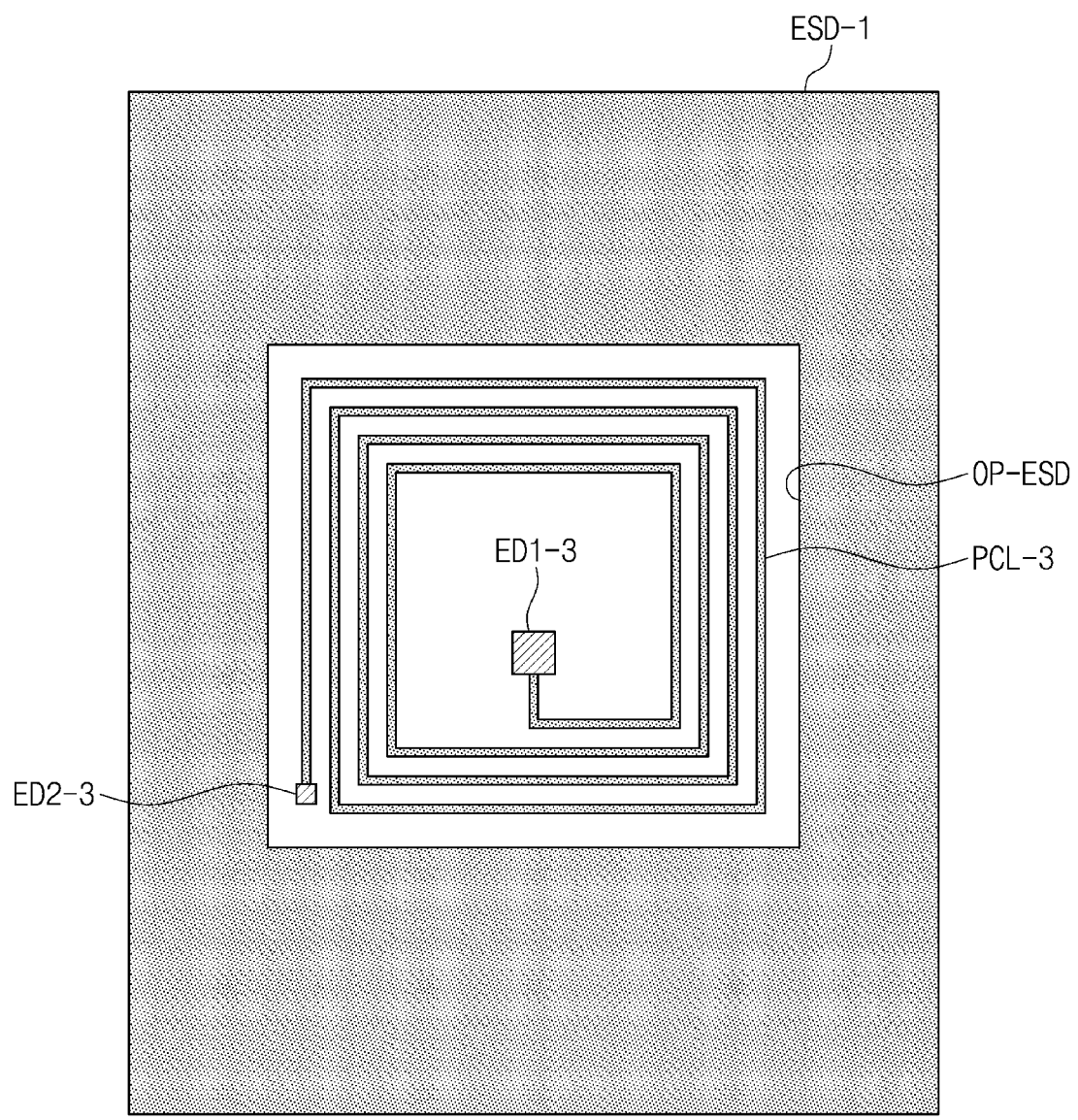
FIG. 15 is a view showing a static electricity blocking member according to an exemplary embodiment of the invention.

FIG. 15 is a view showing a static electricity blocking member ESD-1 according to an exemplary embodiment of the invention.

In an exemplary embodiment of the invention, the static electricity blocking member ESD-1 may have an opening OP-ESD defined therein. In the opening OP-ESD, a planar coil PCL-3 may be disposed.

That is, the planar coil PCL-3 may be disposed on the same layer as the static electricity blocking member ESD-1.

The planar coil PCL-3 may receive alternating current power using a first end ED1-3 and a second end ED2-3.

Figure 16A:
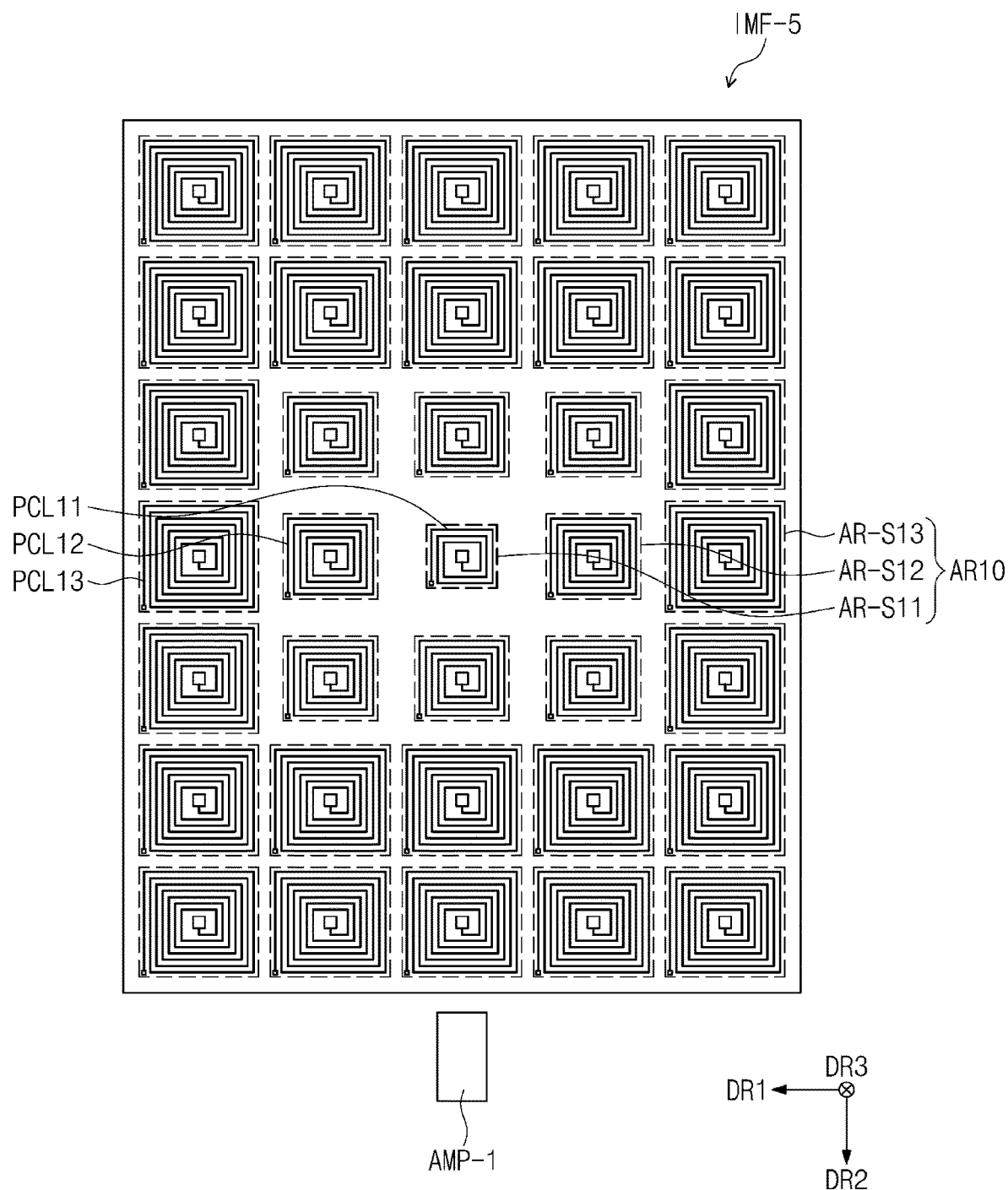
FIG. 16A is a plan view showing an induced magnetic field generating member and a power supply unit according to an exemplary embodiment of the invention.
Figure 16B:
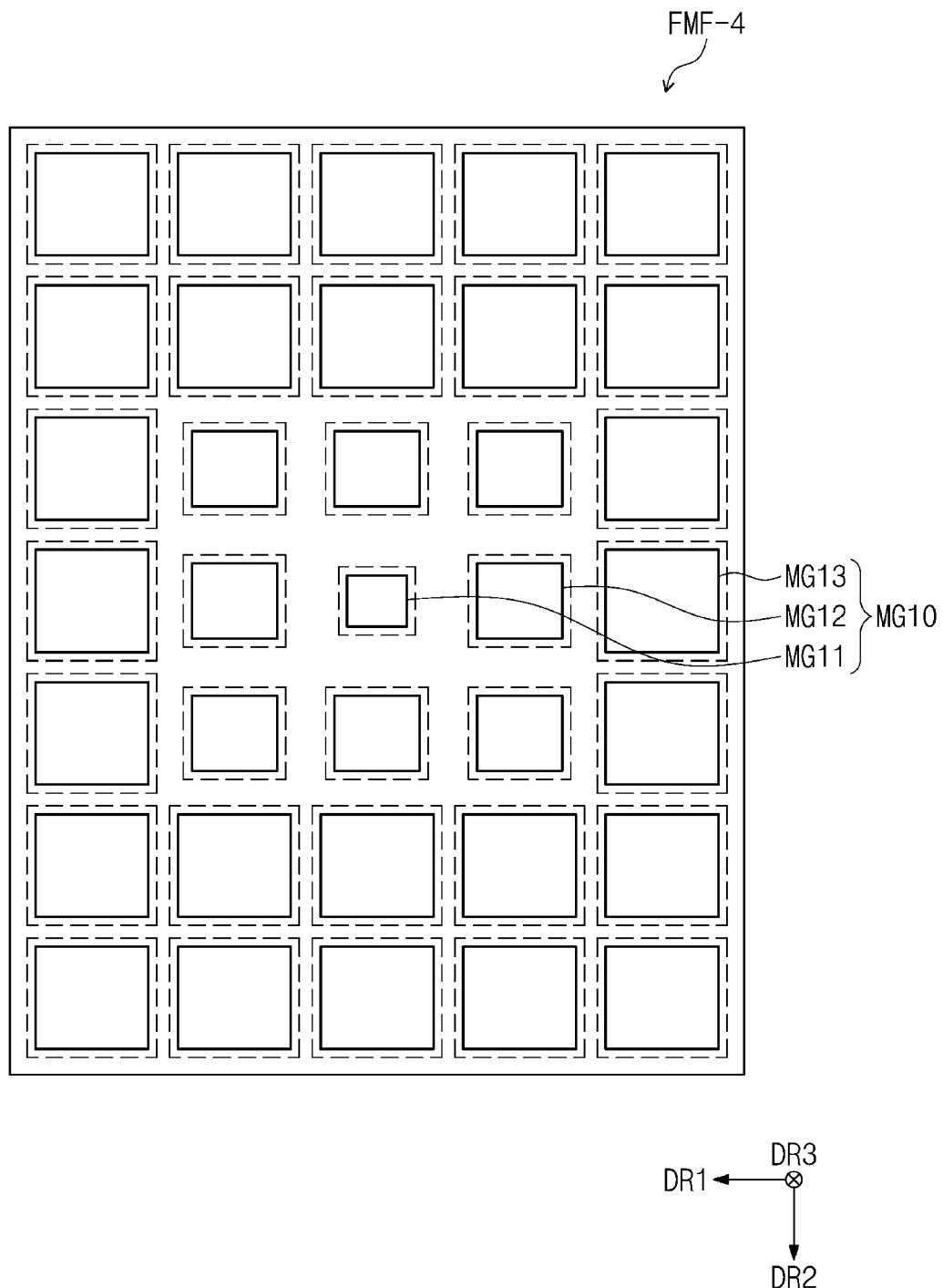
FIG. 16B is a plan view showing a fixed magnetic field generating member according to an exemplary embodiment of the invention.

FIG. 16A is a plan view showing an induced magnetic field generating member IMF-5 and a power supply unit AMP-2 according to an exemplary embodiment of the invention. FIG. 16B is a plan view showing a fixed magnetic field generating member FMF-4 according to an exemplary embodiment of the invention.

The induced magnetic field generating member IMF-5 may include a first planar coil PCL11, a plurality of second planar coils PCL12, and a plurality of third planar coils PCL13.

The induced magnetic field generating member IMF-5 may have a first area AR10 defined therein. The first area AR10 may include a first sub-area AR-S11 in which the first planar coil PCL11 is disposed, second sub-areas AR-S12 in which the second planar coils PCL12 are disposed, and third sub-areas AR-S13 in which the third planar coils PCL13 are disposed.

In an exemplary embodiment of the invention, the length of the second planar coil PCL12 may be greater than the length of the first planar coil PCL11, and the length of the third planar coil PCL13 may be greater than the length of the second planar coil PCL12.

In an exemplary embodiment of the invention, the area of the second sub-area AR-S12 may be greater than the first sub-area AR-S11, and the area of the third sub-area AR-S13 may be greater than the area of the second sub-area AR-S12.

Accordingly, the magnitude of an induced magnetic field generated in the second sub-area AR-S12 may be greater than the magnitude of an induced magnetic field generated in the first sub-area AR-S11, and the magnitude of an induced magnetic field generated in the third sub-area AR-S13 may be greater than the magnitude of an induced magnetic field generated in the second sub-area AR-S12.

Referring to FIG. 1 and FIG. 16A, the third planar coils PCL13 are disposed closer to the non-display area NDA than the second planar coils PCL12, and the second planar coils PCL12 are disposed closer to the non-display area NDA than the first planar coil PCL11. That is, the third sub-areas AR-S3 are disposed closer to the non-display area NDA than the second sub-areas AR-S12, and the second sub-areas AR-S12 are disposed closer to the non-display area NDA than the first sub-area AR-S11.

The power supply unit AMP-2 may provide alternating current power to the planar coils PCL11, PCL12, and PCL13. In FIG. 16A, wirings connecting the power supply unit AMP-2 and the planar coils PCL11, PCL12, and PCL13 are not shown for convenience.

Referring to FIG. 16B, the fixed magnetic field generating member FMF-4 may include a magnet MG10. The magnet MG10 may include a first magnet MG11 corresponding to the first sub-area AR-S11, a second magnet MG12 corresponding to the second sub-area AR-S12, and a third magnet MG13 corresponding to the third sub-area AR-S13.

In an exemplary embodiment of the invention, the area of the second magnet MG12 may be greater than the first magnet MG11, and the area of the third magnet MG13 may be greater than the area of the second magnet MG12. In an exemplary embodiment of the invention, the magnitude of a magnetic field generated from the second magnet MG12 is greater than the magnitude of a magnetic field generated from the first magnet MG11, and the magnitude of a magnetic field generated from the third magnet MG13 may be greater than the magnitude of a magnetic field generated from the second magnet MG12.

A portion adjacent to the non-display area NDA in the display device DD (that is, an edge portion) is fixed by the fixed magnetic field generating member FMF-4 or a separate adhesive member. Accordingly, the amount of vibration generated when a predetermined force is applied to the edge portion of the display device DD is less than the amount of vibration generated when the same predetermined force is applied to a central portion of the display device DD. Accordingly, there is a concern in that the amount of sound generated by vibration may vary. Therefore, as shown in FIG. 16A and FIG. 16B, by allowing the intensity of a magnetic field generated in the edge portion to be greater than the intensity of a magnetic field generated in the central portion, a uniform amount of sound may be generated in the display device DD.

According to an exemplary embodiment of the invention, the thickness of a display device may be reduced.

Although certain exemplary embodiments and have been described herein, other exemplary embodiments and modifications will be apparent from this description. Accordingly, the inventive concepts are not limited to such exemplary embodiments, but rather to the broader scope of the appended claims and various obvious modifications and equivalent arrangements as would be apparent to a person of ordinary skill in the art.

What is claimed is:

1. A display device comprising:
    a display panel comprising a plurality of light emitting elements;
    a first substrate comprising a first planar coil, and disposed under the display panel;
    a second substrate comprising a first magnet spaced apart from the first planar coil by a predetermined distance, and disposed under the display panel; and
    a power supply unit configured to supply alternating current power to the first planar coil,
    wherein:
    the first planar coil and the first magnet overlap each other in a plan view;
    the first magnet is spaced apart from the display panel with the first planar coil arranged therebetween; and
    the first substrate further comprises:
        a first wiring connected to one end of the first planar coil and the power supply unit, and disposed on the same layer as the first planar coil; and
        a second wiring connected to the other end of the first planar coil and the power supply unit, and disposed on a different layer from that of the first planar coil.

2. The display device of claim 1, further comprising:
    a heat dissipating member disposed between the display panel and the first substrate, and comprising graphite; and
    a static electricity blocking member disposed between the heat dissipating member and the first substrate, and comprising metal,
    wherein the first substrate is disposed between the static electricity blocking member and the second substrate.

3. The display device of claim 2, wherein the first planar coil is in contact with the static electricity blocking member.

4. The display device of claim 3, wherein the first planar coil comprises:
    a wiring comprising metal; and
    an insulation film surrounding the wiring.

5. The display device of claim 1, further comprising:
    a heat dissipating member disposed between the display panel and the second substrate, and comprising graphite; and
    a static electricity blocking member disposed between the heat dissipating member and the second substrate, and comprising metal,
    wherein the second substrate is disposed between the static electricity blocking member and the first substrate.

6. The display device of claim 1, wherein the first substrate further comprises:
    a base layer on which the second wiring is disposed; and
    an insulation layer configured to cover the second wiring, disposed on the base layer, and on which the first wiring and the first planar coil are disposed.

7. The display device of claim 1, wherein the first substrate further comprises:
    a first wiring connected to one end of the first planar coil and the power supply unit;
    a base layer on which the first planar coil and the first wiring are disposed;
    an insulation layer configured to cover the first planar coil and the first wiring, defined with a contact hole, and disposed on the base layer;
    a second planar coil disposed on the insulation layer, and including one end connected to the other end of the first planar coil through the contact hole; and
    a second wiring disposed on the insulation layer, and connected to the other end of the second planar coil and the power supply unit.

8. The display device of claim 7, wherein at least a portion of the second planar coil overlaps the first planar coil in a plan view.

9. The display device of claim 1, wherein the first substrate further comprises:
    a second planar coil; and
    a third planar coil disposed between the first planar coil and the second planar coil.

10. The display device of claim 9, wherein each of a length of the first planar coil and a length of the second planar coil is greater than a length of the third planar coil.

11. The display device of claim 9, wherein each of the area of a region in which the first planar coil is disposed and the area of a region in which the second planar coil is disposed is greater than the area of a region in which the third planar coil is disposed.

12. The display device of claim 9, wherein the second substrate further comprises:
    a second magnet spaced apart from the second planar coil by a predetermined distance, and overlapping the second planar coil in a plan view; and
    a third magnet spaced apart from the third planar coil by a predetermined distance, and overlapping the third planar coil in a plan view.

13. The display device of claim 1, wherein the first magnet emits a magnetic field in a first direction, and the second substrate further comprises:
    a second magnet configured to emit a magnetic field in a second direction which is at an angle of 90 degrees to the first direction, and adjacent to the first magnet;

a third magnet configured to emit a magnetic field in a third direction which is at an angle of 180 degrees to the first direction, and adjacent to the second magnet;

a fourth magnet configured to emit a magnetic field in a fourth direction which is at an angle of 180 degrees to the second direction, and adjacent to the third magnet; and a fifth magnet configured to emit a magnetic field in the first direction and disposed adjacent to the fourth magnet.

14. The display device of claim 13, wherein a change from the first direction to the second direction, a change from the second direction to the third direction, and a change from the third direction to the fourth direction are each 90 degrees counterclockwise, respectively.

15. The display device of claim 14, wherein the first planar coil overlaps the second magnet in a plan view, and the first substrate further comprises a second planar coil overlapping the fourth magnet in a plan view.

16. The display device of claim 1, wherein the first substrate contains copper (Cu), an opening is defined in the first substrate, and the first planar coil is disposed in the opening.

17. A display device comprising:
- a display panel comprises a plurality of organic light emitting elements;
- an impact absorbing member disposed under the display panel and having a predetermined elastic force;
- an induced magnetic field generating member comprising a planar coil having a plurality of first coil wirings each extending in a first direction and a plurality of second coil wirings each extending in a second direction crossing the first direction, and disposed under the impact absorbing member, wherein the plurality of first coil wirings are disposed on the same layer as the plurality of second coil wirings;
- a fixed magnetic field generating member disposed under the induced magnetic field generating member, and comprising a magnet spaced apart from the planar coil by a predetermined distance; and
- a power supply unit configured to supply alternating current power to the planar coil, wherein:

the planar coil and the magnet overlap each other in a plan view; and the fixed magnetic field generating member is spaced apart from the display panel with the induced magnetic field generating member arranged therebetween.

18. The display device of claim 17, further comprising:
- a heat dissipating member disposed between the impact absorbing member and the induced magnetic field generating member, and comprising graphite; and
- a static electricity blocking member disposed between the heat dissipating member and the induced magnetic field generating member, and comprising copper (Cu), wherein vibration is generated by a fixed magnetic field generated by the fixed magnetic field generating member and an induced magnetic field generated by the induced magnetic field generating member, and sound is generated by the vibration.

* * * * *